(12) United States Patent
Campbell et al.

(10) Patent No.: US 9,207,002 B2
(45) Date of Patent: Dec. 8, 2015

(54) CONTAMINANT SEPARATOR FOR A VAPOR-COMPRESSION REFRIGERATION APPARATUS

(75) Inventors: Levi A. Campbell, Poughkeepsie, NY (US); Richard C. Chu, Hopewell Junction, NY (US); Evan G. Colgan, Chestnut Ridge, NY (US); Milnes P. David, Fishkill, NY (US); Michael J. Ellsworth, Jr., Lagrangeville, NY (US); Madhusudan K. Iyengar, Woodstock, NY (US); Robert E. Simons, Poughkeepsie, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 643 days.

(21) Appl. No.: 13/271,304

(22) Filed: Oct. 12, 2011

(65) Prior Publication Data

US 2013/0091867 A1    Apr. 18, 2013

(51) Int. Cl.
*F25D 23/12* (2006.01)
*F25B 21/02* (2006.01)
(Continued)

(52) U.S. Cl.
CPC .............. *F25B 21/02* (2013.01); *B23P 15/26* (2013.01); *F25B 43/00* (2013.01); *F25B 43/003* (2013.01);
(Continued)

(58) Field of Classification Search
CPC ............... F25B 21/02; H05K 7/20809; H05K 7/20836; H01L 35/30; H01L 23/427; F24B 43/003
USPC ............................ 62/3.2, 3.3, 259.2, 123, 318
See application file for complete search history.

(56) References Cited

U.S. PATENT DOCUMENTS

| 526,432 A | 9/1894 | Biddle |
|---|---|---|
| 4,000,626 A | 1/1977 | Webber |

(Continued)

FOREIGN PATENT DOCUMENTS

| DE | 29903863 U1 | 11/1999 |
|---|---|---|
| DE | 19903743 A1 | 8/2000 |

(Continued)

OTHER PUBLICATIONS

Campbell et al., Notice of Allowance for U.S. Appl. No. 13/271,290, filed Oct. 12, 2011 (U.S. Pat. No. 2013/0091886 A1), dated Dec. 24, 2013 (7 pages).

(Continued)

*Primary Examiner* — Cheryl J Tyler
*Assistant Examiner* — Melanie Phero
(74) *Attorney, Agent, or Firm* — Steven Chiu, Esq.; Kevin P. Radigan, Esq.; Heslin Rothenberg Farley & Mesiti P.C.

(57) ABSTRACT

Apparatuses and methods are provided for facilitating cooling of an electronic component. The apparatus includes a vapor-compression refrigeration system, which includes an expansion component, an evaporator, a compressor and a condenser coupled in fluid communication. The evaporator is coupled to and cools the electronic component. The apparatus further includes a contaminant separator coupled in fluid communication with the refrigerant flow path. The separator includes a refrigerant cold filter and a thermoelectric array. At least a portion of refrigerant passing through the refrigerant flow path passes through the cold filter, and the thermoelectric array provides cooling to the cold filter to cool refrigerant passing through the filter. By cooling refrigerant passing through the filter, contaminants solidify from the refrigerant, and are deposited in the cold filter. The separator may further include a refrigerant hot filter coupled to a hot side of the thermoelectric array for further filtering the refrigerant.

15 Claims, 11 Drawing Sheets

(51) Int. Cl.
*F25B 43/00* (2006.01)
*H05K 7/20* (2006.01)
*B23P 15/26* (2006.01)

(52) U.S. Cl.
CPC ........ *H05K 7/20809* (2013.01); *H05K 7/20836* (2013.01); *F25B 2400/01* (2013.01); *Y10T 29/49359* (2015.01)

(56) References Cited

U.S. PATENT DOCUMENTS

| | | | |
|---|---|---|---|
| 4,091,637 | A | 5/1978 | Vogel et al. |
| 4,170,998 | A | 10/1979 | Sauder |
| 4,313,310 | A | 2/1982 | Kobayashi et al. |
| 4,554,792 | A | 11/1985 | Margulefsky et al. |
| 4,598,764 | A | 7/1986 | Beckey |
| 4,831,830 | A | 5/1989 | Swenson |
| 4,934,155 | A | 6/1990 | Lowes |
| 5,060,481 | A | 10/1991 | Bartlett et al. |
| 5,151,777 | A | 9/1992 | Akin et al. |
| 5,217,063 | A | 6/1993 | Scaringe et al. |
| 5,412,884 | A | 5/1995 | Staples et al. |
| 5,514,595 | A | 5/1996 | Olds et al. |
| 5,538,598 | A | 7/1996 | Schlesinger et al. |
| 5,597,533 | A | 1/1997 | Olds et al. |
| 5,737,923 | A | 4/1998 | Gilley et al. |
| 5,827,424 | A * | 10/1998 | Gillis et al. ............ 210/180 |
| 5,860,280 | A | 1/1999 | Recine, Sr. et al. |
| 5,862,675 | A * | 1/1999 | Scaringe et al. ............ 62/196.3 |
| 5,867,990 | A | 2/1999 | Ghoshal et al. |
| 5,896,922 | A | 4/1999 | Chrysler et al. |
| 5,963,458 | A | 10/1999 | Cascia |
| 5,970,731 | A | 10/1999 | Hare et al. |
| 6,003,319 | A | 12/1999 | Gilley et al. |
| 6,213,194 | B1 | 4/2001 | Chrysler et al. |
| 6,284,406 | B1 | 9/2001 | Xing et al. |
| 6,305,463 | B1 | 10/2001 | Salmonson |
| 6,351,950 | B1 | 3/2002 | Duncan |
| 6,378,311 | B1 * | 4/2002 | McCordic ............ 62/3.4 |
| 6,397,618 | B1 | 6/2002 | Chu et al. |
| 6,467,303 | B2 | 10/2002 | Ross |
| 6,474,074 | B2 | 11/2002 | Choshal |
| 6,557,354 | B1 | 5/2003 | Chu et al. |
| 6,635,655 | B1 | 10/2003 | Jayyosi et al. |
| 6,666,905 | B2 * | 12/2003 | Page et al. ............ 95/1 |
| 6,705,089 | B2 | 3/2004 | Chu et al. |
| 6,760,221 | B2 | 7/2004 | Goth et al. |
| 6,786,081 | B1 | 9/2004 | Hildebrandt et al. |
| 6,820,435 | B2 | 11/2004 | Anderson et al. |
| 6,829,145 | B1 | 12/2004 | Corrado et al. |
| 6,845,622 | B2 | 1/2005 | Sauciuc et al. |
| 6,952,938 | B2 | 10/2005 | Albertson |
| 6,993,920 | B2 | 2/2006 | Lifson et al. |
| 7,085,626 | B2 | 8/2006 | Harrod et al. |
| 7,086,247 | B2 | 8/2006 | Campbell et al. |
| 7,089,752 | B2 | 8/2006 | Jeong et al. |
| 7,278,269 | B2 | 10/2007 | Pham et al. |
| 7,310,953 | B2 | 12/2007 | Pham et al. |
| 7,342,787 | B1 | 3/2008 | Bhatia |
| 7,382,047 | B2 | 6/2008 | Chen et al. |
| 7,401,472 | B2 | 7/2008 | Manole |
| 7,554,808 | B2 | 6/2009 | Scott et al. |
| 7,626,407 | B2 | 12/2009 | Kabbani |
| 7,753,991 | B2 * | 7/2010 | Kertzman ............ 95/52 |
| 2001/0000880 | A1 | 5/2001 | Chu et al. |
| 2003/0014987 | A1 | 1/2003 | Levenduski et al. |
| 2003/0167780 | A1 | 9/2003 | Domyo |
| 2005/0122685 | A1 | 6/2005 | Chu et al. |
| 2005/0262870 | A1 | 12/2005 | Narayanamurthy et al. |
| 2006/0042289 | A1 | 3/2006 | Campbell et al. |
| 2006/0042311 | A1 | 3/2006 | Esslinger |
| 2006/0118274 | A1 * | 6/2006 | Lee et al. ............ 165/58 |
| 2007/0044493 | A1 | 3/2007 | Kearney et al. |
| 2007/0199335 | A1 | 8/2007 | Innes |
| 2007/0277536 | A1 | 12/2007 | Judge |
| 2008/0307806 | A1 | 12/2008 | Campbell et al. |
| 2009/0158768 | A1 | 6/2009 | Rafalovich et al. |
| 2010/0073863 | A1 | 3/2010 | Matshushima et al. |
| 2010/0079952 | A1 | 4/2010 | Liang et al. |
| 2010/0281891 | A1 | 11/2010 | Behrends et al. |
| 2012/0111028 | A1 * | 5/2012 | Campbell et al. ............ 62/3.7 |
| 2013/0091871 | A1 | 4/2013 | Campbell et al. |
| 2013/0091886 | A1 | 4/2013 | Campbell et al. |

FOREIGN PATENT DOCUMENTS

| | | |
|---|---|---|
| EP | 0025665 A1 | 3/1981 |
| EP | 1031808 A2 | 8/2000 |
| EP | 1 986 076 A1 | 10/2008 |
| EP | 2 051 026 A1 | 4/2009 |
| JP | 1098885 A | 4/1989 |
| JP | 10223442 A | 8/1998 |
| JP | 2006162246 A | 6/2006 |
| JP | 2008014563 A | 1/2008 |
| WO | WO 97/14918 A1 | 4/1997 |
| WO | WO2010017536 A2 | 2/2010 |
| WO | WO 2010/093549 A1 | 8/2010 |
| WO | WO 2011/009411 A1 | 1/2011 |

OTHER PUBLICATIONS

Torok et al., "Packaging Design of the IBM System z10 Enterprise Class Platform Central Electronic Complex", IBM Journal of Research & Development, vol. 53, No. 1, Paper 9 (2009).

Ellsworth, Jr. et al., "The Evolution of Water Cooling for IBM Larger Server Systems: Back to the Future", IBM Corporation, Poughkeepsie, NY (2008).

International Search Report and Written Opinion from International Application No. PCT/EP2008/055758, dated Oct. 29, 2008.

Simons, Robert E., "Application of Thermoelectric Coolers for Module Cooling Enhancement" (http://www.electronics-cooling.com/2000/05/application-of-thermoelectric-coolers-for-module-cooling-enhancement/) (May 1, 2000).

Tellurex, "An Introduction to Thermoelectrics", (http://www.tellurex.com/pdf/introduction-to-thermoelectrics.pdf) (2010).

Tellurex, "An Introduction to Temperature Control of Thermoelectric Systems", (http://www.tellurex.com/pdf/introduction-to-temperature-control.pdf) (2010).

Tellurex, "Frequently Asked Questions About Our Power Generation Technology", (http://www.tellurex.com/pdf/seebeck-faq.pdf) (2010).

Tellurex, "Frequently Asked Questions About Our Cooling and Heating Technology", (http://www.tellurex.com/pdf/peltier-faq.pdf) (2010).

Campbell et al., "Thermoelectric-Enhanced, Vapor-Compression Refrigeration Apparatus Facilitating Cooling of an Electronic Component", U.S. Appl. No. 12/939,574, filed Nov. 4, 2010.

* cited by examiner

CONTAMINANT SEPARATOR FOR A VAPOR-COMPRESSION REFRIGERATION APPARATUS

BACKGROUND

The power dissipation of integrated circuit chips, and the modules containing the chips, continues to increase in order to achieve increases in processor performance. This trend poses a cooling challenge at both the module and system level. Increased airflow rates are needed to effectively cool high power modules and to limit the temperature of the air that is exhausted into the computer center.

In many large server applications, processors along with their associated electronics (e.g., memory, disk drives, power supplies, etc.) are packaged in removable node configurations stacked within an electronics (or IT) rack or frame. In other cases, the electronics may be in fixed locations within the rack or frame. Typically, the components are cooled by air moving in parallel airflow paths, usually front-to-back, impelled by one or more air moving devices (e.g., fans or blowers). In some cases it may be possible to handle increased power dissipation within a single node by providing greater airflow, through the use of a more powerful air moving device or by increasing the rotational speed (i.e., RPMs) of an existing air moving device. However, this approach is becoming problematic at the rack level in the context of a computer installation (i.e., data center).

The sensible heat load carried by the air exiting the rack is stressing the ability of the room air-conditioning to effectively handle the load. This is especially true for large installations with "server farms" or large banks of computer racks close together. In such installations, liquid cooling (e.g., water cooling) is an attractive technology to manage the higher heat fluxes. The liquid absorbs the heat dissipated by the components/modules in an efficient manner. Typically, the heat is ultimately transferred from the liquid to an outside environment, whether air or other liquid coolant.

BRIEF SUMMARY

In one aspect, the shortcomings of the prior art are overcome and additional advantages are provided through the provision of an apparatus for facilitating cooling of an electronic component. The apparatus includes a vapor-compression refrigeration system and a contaminant separator. The vapor-compression refrigeration system includes a refrigerant expansion component, a refrigerant evaporator, a compressor and a condenser coupled in fluid communication to define a refrigerant flow path and allow the flow of refrigerant therethrough. The refrigerant evaporator is configured to couple to the electronic component to be cooled. The contaminant separator is coupled in fluid communication with the refrigerant flow path, and includes a refrigerant cold filter and a thermoelectric array. At least a portion of refrigerant passing through the refrigerant flow path passes through the refrigerant cold filter, and the thermoelectric array provides cooling to the refrigerant cold filter to cool refrigerant passing therethrough, and therefore facilitate deposition in the refrigerant cold filter of contaminants solidifying from the refrigerant due to cooling of the refrigerant in the refrigerant cold filter.

In another aspect, a cooled electronic system is provided which includes at least one heat-generating electronic component, a vapor-compression refrigeration system coupled to the at least one heat-generating electronic component, a refrigerant flow path, and a contaminant separator. The vapor-compression refrigeration system includes a refrigerant expansion component, a refrigerant evaporator, a compressor, and a condenser, and wherein the refrigerant evaporator is coupled to the at least one heat-generating electronic component. The refrigerant flow path couples in fluid communication the refrigerant expansion component, the refrigerant evaporator, the compressor and the condenser. The contaminant separator includes a refrigerant cold filter and a thermoelectric array. At least a portion of refrigerant passing through the refrigerant flow path passes through the refrigerant cold filter, and the thermoelectric array provides cooling to the refrigerant cold filter to cool refrigerant passing therethrough, and thereby facilitate deposition in the refrigerant cold filter of contaminants solidifying from the refrigerant due to cooling of the refrigerant in the refrigerant cold filter.

In a further aspect, a method of fabricating a vapor-compression refrigeration system for cooling at least one heat-generating electronic component is provided. The method includes: providing a condenser, a refrigerant expansion structure, a refrigerant evaporator, and a compressor; coupling the condenser, refrigerant expansion structure, refrigerant evaporator, and compressor in fluid communication to define a refrigerant flow path; providing a contaminant separator in fluid communication with the refrigerant flow path, the contaminant separator including a refrigerant cold filter, wherein at least a portion of the refrigerant passing through the refrigerant flow path passes through the refrigerant cold filter, and a thermoelectric array providing cooling to the refrigerant cold filter to cool refrigerant passing through the refrigerant cold filter, and facilitate deposition in the refrigerant cold filter of contaminants solidifying from the refrigerant due to cooling of the refrigerant in the refrigerant cold filter; and providing refrigerant within the refrigerant flow path of the vapor-compression refrigeration system to allow for cooling of the at least one heat-generating electronic component employing sequential vapor-compression cycles, wherein the contaminant separator removes contaminants from the refrigerant commensurate with the sequential vapor-compression cycles.

Additional features and advantages are realized through the techniques of the present invention. Other embodiments and aspects of the invention are described in detail herein and are considered a part of the claimed invention.

BRIEF DESCRIPTION OF THE SEVERAL VIEWS OF THE DRAWINGS

One or more aspects of the present invention are particularly pointed out and distinctly claimed as examples in the claims at the conclusion of the specification. The foregoing and other objects, features, and advantages of the invention are apparent from the following detailed description taken in conjunction with the accompanying drawings in which:

DETAILED DESCRIPTION

Figure 1:
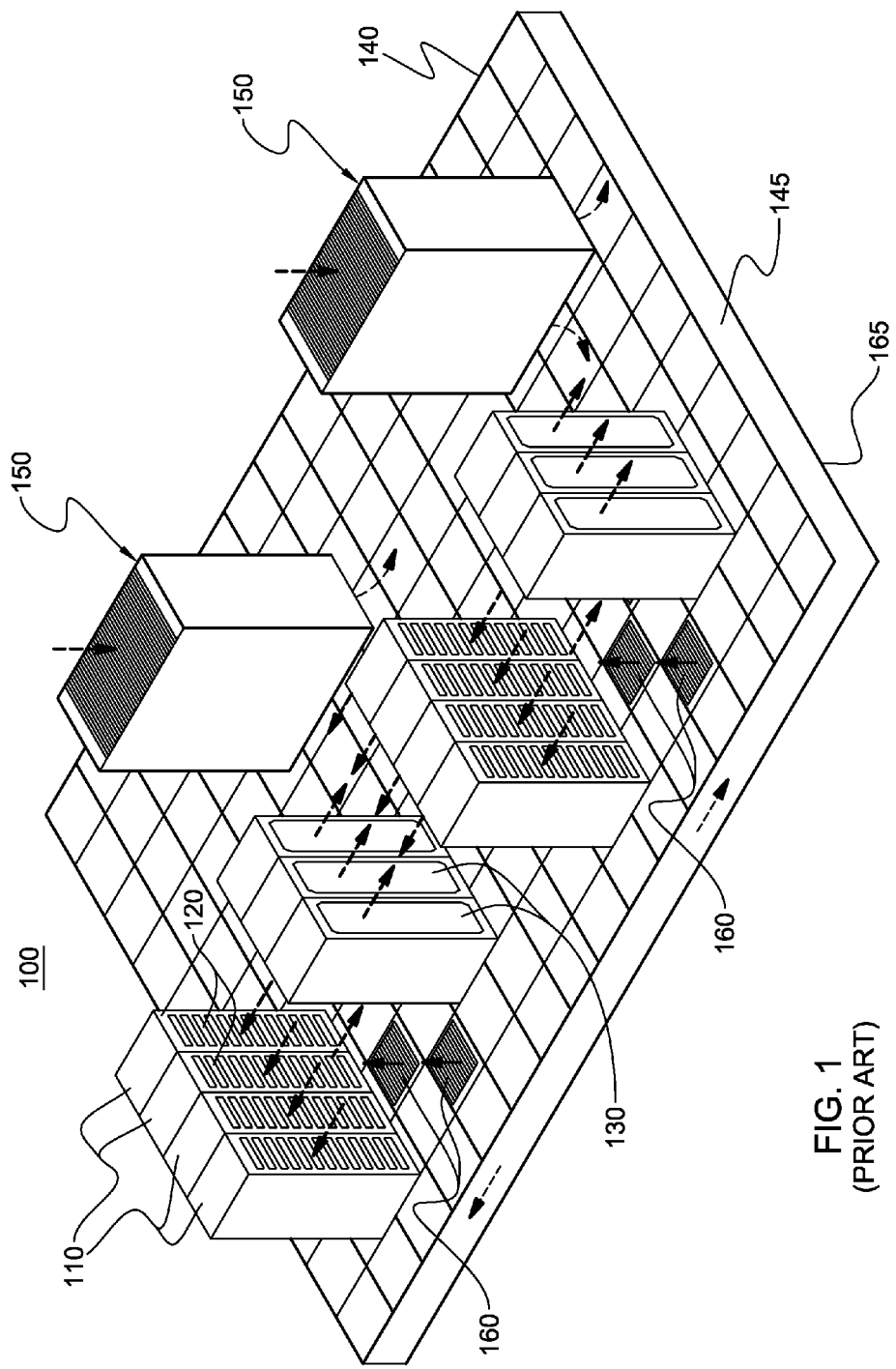
FIG. 1 depicts one embodiment of a conventional raised floor layout of an air-cooled data center.

As used herein, the terms "electronics rack", "rack-mounted electronic equipment", and "rack unit" are used interchangeably, and unless otherwise specified include any housing, frame, rack, compartment, blade server system, etc., having one or more heat generating components of a computer system or electronics system, and may be, for example, a stand alone computer processor having high, mid or low end processing capability. In one embodiment, an electronics rack may comprise an IT rack with multiple electronic subsystems, each having one or more heat generating components disposed therein requiring cooling. "Electronic subsystem" refers to any sub-housing, blade, book, drawer, node, compartment, etc., having one or more heat generating electronic components disposed therein. Each electronic subsystem of an electronics rack may be movable or fixed relative to the electronics rack, with rack-mounted electronics drawers of a multi-drawer rack unit and blades of a blade center system being two examples of subsystems of an electronics rack to be cooled.

"Electronic component" refers to any heat generating electronic component or module of, for example, a computer system or other electronic unit requiring cooling. By way of example, an electronic component may comprise one or more integrated circuit dies and/or other electronic devices to be cooled, including one or more processor dies, memory dies and memory support dies. As a further example, the electronic component may comprise one or more bare dies or one or more packaged dies disposed on a common carrier. Further, unless otherwise specified herein, the term "liquid-cooled cold plate" or "coolant-cooled structure" refers to any thermally conductive structure having a plurality of channels (or passageways) formed therein for flowing of coolant therethrough. A "coolant-cooled structure" may function, in one example, as a refrigerant evaporator.

As used herein, "refrigerant-to-air heat exchanger" means any heat exchange mechanism characterized as described herein through which refrigerant coolant can circulate; and includes, one or more discrete refrigerant-to-air heat exchangers coupled either in series or in parallel. A refrigerant-to-air heat exchanger may comprise, for example, one or more coolant flow paths, formed of thermally conductive tubing (such as copper or other tubing) in thermal or mechanical contact with a plurality of air-cooled cooling or condensing fins. Size, configuration and construction of the refrigerant-to-air heat exchanger can vary without departing from the scope of the invention disclosed herein.

Unless otherwise specified, "refrigerant evaporator" refers to a heat-absorbing mechanism or structure within a refrigeration loop. The refrigerant evaporator is alternatively referred to as a "sub-ambient evaporator" when temperature of the refrigerant passing through the refrigerant evaporator is below the temperature of ambient air entering the electronics rack. In one example, the refrigerant evaporator comprises a coolant-to-refrigerant heat exchanger. Within the refrigerant evaporator, heat is absorbed by evaporating the refrigerant of the refrigerant loop. Still further, "data center" refers to a computer installation containing one or more electronics racks to be cooled. As a specific example, a data center may include one or more rows of rack-mounted computing units, such as server units.

As used herein, the phrase "controllable thermoelectric array" refers to an adjustable thermoelectric array which allows active control of an auxiliary heat load applied to refrigerant passing through the refrigerant loop of a cooling apparatus, in a manner as described herein. In one example, the controllable thermoelectric array comprises one or more thermoelectric modules, each comprising one or more thermoelectric elements, coupled in thermal communication with the refrigerant passing through the compressor and powered by an electrical power source.

One example of the refrigerant employed in the examples below is R134a refrigerant. However, the concepts disclosed herein are readily adapted to use with other types of refrigerant. For example, R245fa, R404, R12, or R22 refrigerant may be employed.

Reference is made below to the drawings, which are not drawn to scale for ease of understanding, wherein the same reference numbers used throughout different figures designate the same or similar components.

FIG. 1 depicts a raised floor layout of an air cooled data center 100 typical in the prior art, wherein multiple electronics racks 110 are disposed in one or more rows. A data center such as depicted in FIG. 1 may house several hundred, or even several thousand microprocessors. In the arrangement illustrated, chilled air enters the computer room via perforated floor tiles 160 from a supply air plenum 145 defined between the raised floor 140 and a base or sub-floor 165 of the room. Cooled air is taken in through louvered or screened doors at air inlet sides 120 of the electronics racks and expelled through the back (i.e., air outlet sides 130) of the electronics racks. Each electronics rack 110 may have one or more air moving devices (e.g., fans or blowers) to provide forced inlet-to-outlet airflow to cool the electronic components within the drawer(s) of the rack. The supply air plenum 145 provides conditioned and cooled air to the air-inlet sides of the electronics racks via perforated floor tiles 160 disposed in a "cold" aisle of the computer installation. The conditioned and cooled air is supplied to plenum 145 by one or more air conditioning units 150, also disposed within the data center 100. Room air is taken into each air conditioning unit 150 near an upper portion thereof. This room air comprises in part exhausted air from the "hot" aisles of the computer installation defined by opposing air outlet sides 130 of the electronics racks 110.

In high performance server systems, it has become desirable to supplement air-cooling of selected high heat flux electronic components, such as the processor modules, within the electronics rack. For example, the System Z® server marketed by International Business Machines Corporation, of Armonk, N.Y., employs a vapor-compression refrigeration cooling system to facilitate cooling of the processor modules within the electronics rack. This refrigeration system employs R134a refrigerant as the coolant, which is supplied to a refrigerant evaporator coupled to one or more processor modules to be cooled. The refrigerant is provided by a modular refrigeration unit (MRU), which supplies the refrigerant at an appropriate temperature.

Figure 2B:
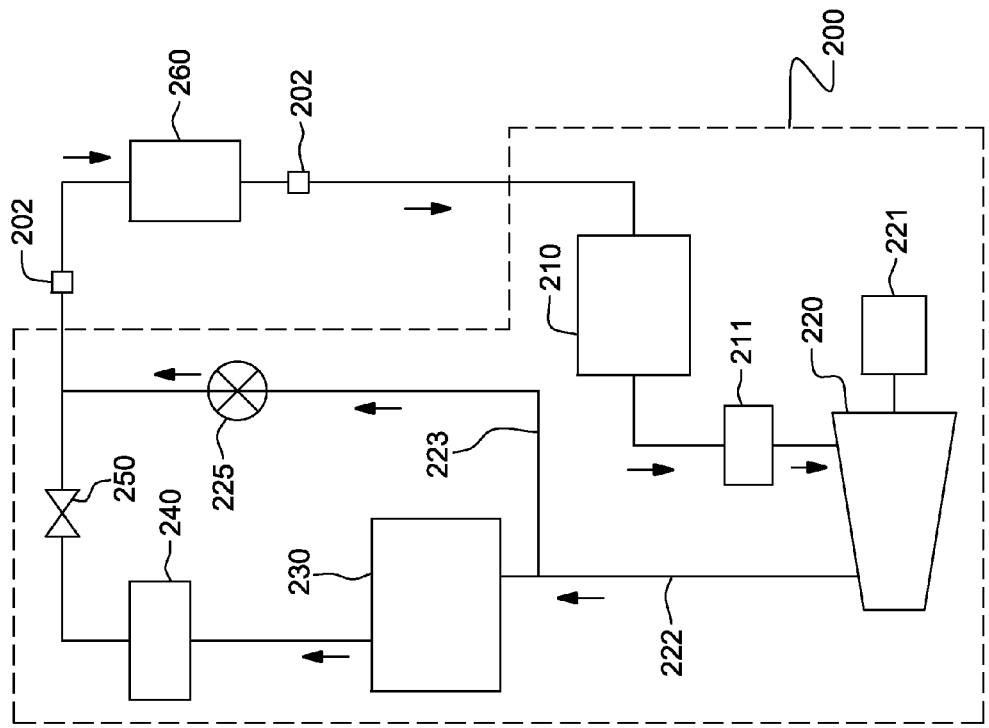
FIG. 2B is a schematic of one embodiment of a vapor-compression refrigeration system for cooling an evaporator (or cold plate) coupled to a high heat flux electronic component (e.g., module) to be cooled, in accordance with one or more aspects of the present invention.
Figure 2A:
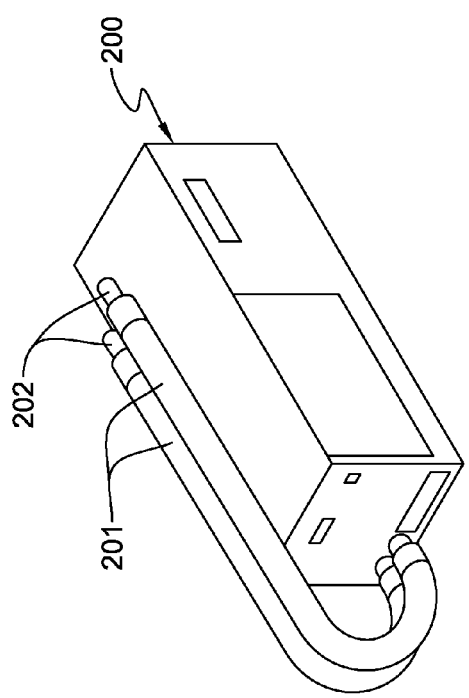
FIG. 2A is an isometric view of one embodiment of a modular refrigeration unit (MRU) and its quick connects for attachment to a cold plate and/or evaporator disposed within an electronics rack to cool one or more electronic components (e.g., modules) thereof, in accordance with one or more aspects of the present invention.

FIG. 2A depicts one embodiment of a modular refrigeration unit 200, which may be employed within an electronics rack, in accordance with an aspect of the present invention. As illustrated, modular refrigeration unit 200 includes refrigerant supply and exhaust hoses 201 for coupling to a refrigerant evaporator or cold plate (not shown), as well as quick connect couplings 202, which respectively connect to corresponding quick connect couplings on either side of the refrigerant evaporator, that is coupled to the electronic component(s) or module(s) (e.g., server module(s)) to be cooled. Further details of a modular refrigeration unit such as depicted in FIG. 2A are provided in commonly assigned U.S. Pat. No. 5,970,731.

FIG. 2B is a schematic of one embodiment of modular refrigeration unit 200 of FIG. 2A, coupled to a refrigerant evaporator for cooling, for example, an electronic component within an electronic subsystem of an electronics rack. The electronic component may comprise, for example, a multichip module, a processor module, or any other high heat flux electronic component (not shown) within the electronics rack. As illustrated in FIG. 2B, a refrigerant evaporator 260 is shown that is coupled to the electronic component (not shown) to be cooled and is connected to modular refrigeration unit 200 via respective quick connect couplings 202. Within modular refrigeration unit 200, a motor 221 drives a compressor 220, which is connected to a condenser 230 by means of a supply line 222. Likewise, condenser 230 is connected to evaporator 260 by means of a supply line which passes through a filter/dryer 240, which functions to trap particulate matter present in the refrigerant stream and also to remove any water which may have become entrained in the refrigerant flow. Subsequent to filter/dryer 240, refrigerant flow passes through an expansion device 250. Expansion device 250 may be an expansion valve. However, it may also comprise a capillary tube or thermostatic valve. Thus, expanded and cooled refrigerant is supplied to evaporator 260. Subsequent to the refrigerant picking up heat from the electronic component coupled to evaporator 260, the refrigerant is returned via an accumulator 210 which operates to prevent liquid from entering compressor 220. Accumulator 210 is also aided in this function by the inclusion of a smaller capacity accumulator 211, which is included to provide an extra degree of protection against the entry of liquid-phase refrigerant into compressor 220. Subsequent to accumulator 210, vapor-phase refrigerant is returned to compressor 220, where the cycle repeats. In addition, the modular refrigeration unit is provided with a hot gas bypass valve 225 in a bypass line 223 selectively passing hot refrigerant gasses from compressor 220 directly to evaporator 260. The hot gas bypass valve is controllable in response to the temperature of evaporator 260, which is provided by a module temperature sensor (not shown), such as a thermistor device affixed to the evaporator/cold plate in any convenient location. In one embodiment, the hot gas bypass valve is electronically controlled to shunt hot gas directly to the evaporator when temperature is already sufficiently low. In particular, under low temperature conditions, motor 221 runs at a lower speed in response to the reduced thermal load. At these lower speeds and loads, there is a risk of motor 221 stalling. Upon detection of such a condition, the hot gas bypass valve is opened in response to a signal supplied to it from a controller of the modular refrigeration unit.

Figure 3:
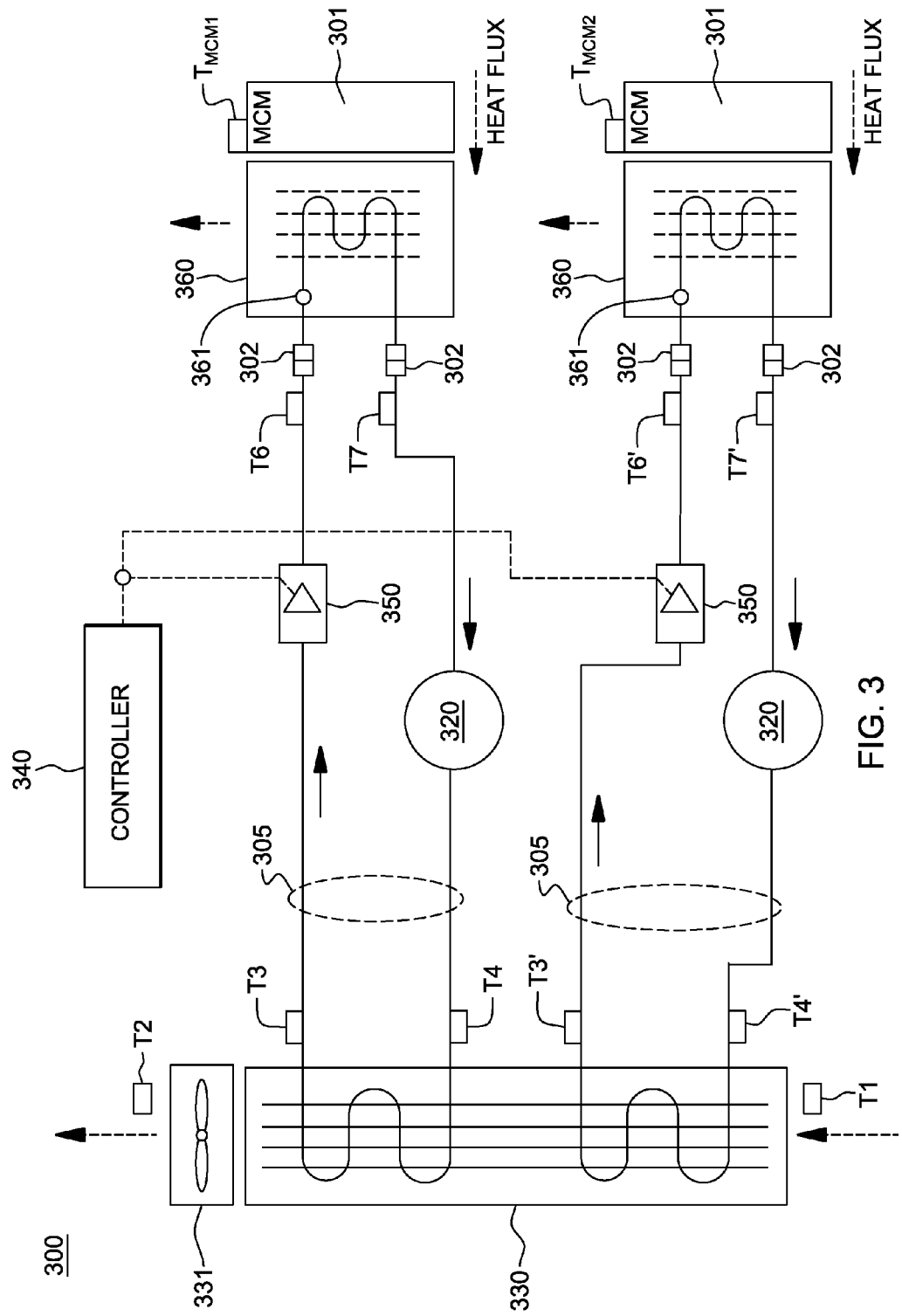
FIG. 3 is an schematic of an alternate embodiment of a vapor-compression refrigeration system for cooling one or more evaporators coupled to respective electronic components to be cooled, in accordance with one or more aspects of the present invention.

FIG. 3 depicts an alternate embodiment of a modular refrigeration unit 300, which may be employed within an electronics rack, in accordance with an aspect of the present invention. Modular refrigeration unit 300 includes (in this example) two refrigerant loops 305, including sets of refrigerant supply and exhaust hoses, coupled to respective refrigerant evaporators (or cold plates) 360 via quick connect couplings 302. Each refrigerant evaporator 360 is in thermal communication with a respective electronic component 301 (e.g., multichip module (MCM)) for facilitating cooling thereof. Refrigerant loops 305 are independent, and shown to include a compressor 320, a respective condenser section of a shared condenser 330 (i.e., a refrigerant-to-air heat exchanger with an associated air-moving device), and an expansion (and flow control) valve 350, which is employed to maintain temperature of the electronic component at a steady temperature level, e.g., 29° C. In one embodiment, the expansion valves 350 are controlled by the controller 340 based on the temperature of the respective electronic component 301 $T_{MCM1}$, $T_{MCM2}$. The refrigerant and coolant loops may also contain further sensors, such as sensors for condenser air temperature in T1, condenser air temperature out T2, temperature T3, T3' of high-pressure liquid refrigerant flowing from the condenser 330 to the respective expansion valve 350, temperature T4, T4' of high-pressure refrigerant vapor flowing from each compressor 320 to the respective condenser section 330, temperature T6, T6' of low-pressure liquid refrigerant flowing from each expansion valve 350 into the respective evaporator 360, and temperature T7, T7' of low-pressure vapor refrigerant flowing from the respective evaporator 360 towards the compressor 320. Note that in this implementation, the expansion valves 350 operate to actively throttle the pumped refrigerant flow rate, as well as to function as expansion orifices to reduce the temperature and pressure of refrigerant passing through them. Note also that, in the embodiment depicted, refrigerant evaporators 360 further comprise a fixed orifice 361 integral with the respective evaporator. This fixed orifice functions as a second refrigerant expansion component, which provides a fixed expansion of the refrigerant at, for example, the inlet of the evaporator 360, to provide additional cooling of the refrigerant within the evaporator prior to absorbing heat from the respective electronic component 301.

In situations where electronic component 301 temperature decreases (i.e., the heat load decreases), the respective expansion valve 350 is partially closed to reduce the refrigerant flow passing through the associated evaporator 360 in an attempt to control temperature of the electronic component. If temperature of the component increases (i.e., heat load increases), then the controllable expansion valve 350 is opened further to allow more refrigerant flow to pass through the associated evaporator, thus providing increased cooling to the component.

Figure 4:
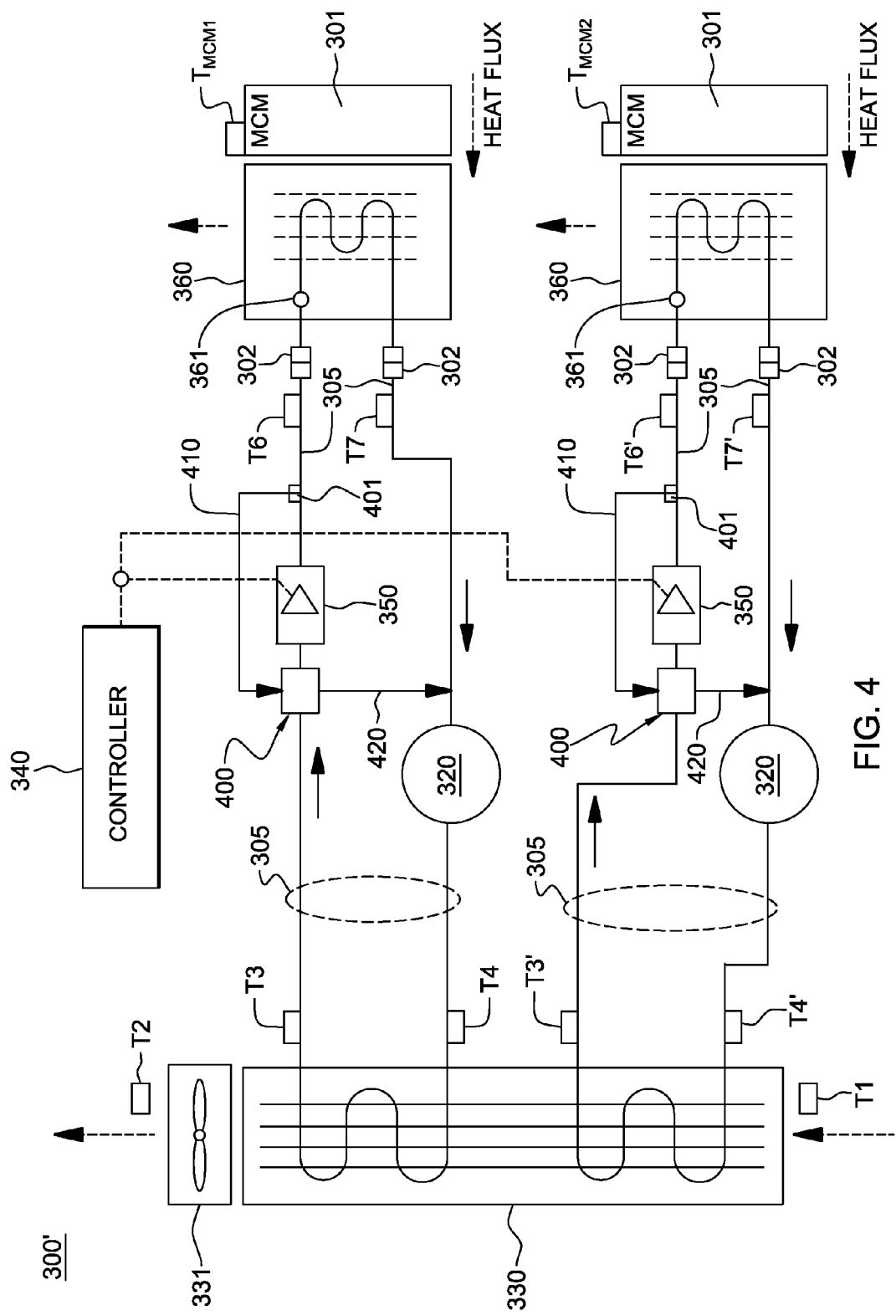
FIG. 4 is a schematic of another embodiment of a vapor-compression refrigeration system for cooling evaporator(s) coupled to one or more respective electronic components to be cooled, and employing contaminant cold trap(s), in accordance with one or more aspects of the present invention.

In accordance with another aspect of the present invention, FIG. 4 depicts a variation of the cooling apparatus of FIG. 3, wherein a contaminant cold trap is provided to facilitate removal of contaminants from refrigerant circulating through the refrigerant loop (or refrigerant flow path). In the embodiment of FIG. 4, a dual loop, cooled electronic system is depicted by way of example. However, those skilled in the art should note that the cooling apparatus depicted therein and described below can be readily configured as a single loop or other multi-loop system for cooling a single electronic component, or a plurality of electronic components (either with or without employing a shared condenser, as in the example of FIG. 4).

As described above, vapor-compression cycle refrigeration can be employed to cool electronic components, such as multichip modules, in electronics racks, such as main frame computers. The power variations in the multichip modules and energy efficiency concerns dictate that an electronic expansion valve (EEV) be employed to control the mass flow rate of refrigerant to the evaporator, which as noted above, is conduction coupled to the electronic component (e.g., MCM). Control of the MCM temperature within a desired band is achieved by manipulating the refrigerant flow rate via the EEV. The refrigerant, in practice, is supplemented by a lubricating oil for the compressor, and passes through fittings containing O-rings, and through a filter/dryer. These materials are somewhat mutually soluble, and thus may contaminate the refrigerant. In the EEV, and any other expansion component of the vapor-compression refrigeration loop, the thermodynamic state of the refrigerant and the contaminant mixture is altered, and the contaminants may come out of solution on working components of the system, such as the EEV internal surfaces.

Specifically, it has been discovered that material can agglomerate in certain pressure drop areas of the expansion structures within the refrigeration system. During refrigerant-oil mixture transport, certain impurities and chemically reacted byproducts may come out of solution in the pressure drop areas as the refrigerant cools down. By way of example, an expansion valve may include a first element having an expansion orifice, and a second element having a tapered expansion pin. The expansion pin controls the amount of refrigerant passing through the expansion orifice, through which refrigerant flows. For the cooling applications described hereinabove, the expansion pin is stepped open in very small increments to allow controlled flow of refrigerant through expansion orifice into a pressure drop area of the expansion device.

During refrigerant-oil mixture transport through a hot compressor, any long-chain molecules and other typically non-soluble compounds at room temperature can go into solution in the hot mixture. These, as well as other physically transported impurities, then fall out of the solution when the refrigerant-oil mixture cools down, for example, in the pressure drop areas of the expansion structure. A layer of "waxy" material can build up in the pressure drop areas and act as a sticky substance which then catches other impurities. This amassing of material can interfere with the normal control expansion volumes and interfere with the control of motor steps (e.g., due to unpredictable valve characteristic changes). This is particularly true in a vapor compression refrigeration system employed as described above since the control of the expansion valves in this implementation is very sensitive and refrigerant expansion structure geometries are typically very small.

One solution to the problem is depicted in FIG. 4. As noted, cooling apparatus 300' depicted in FIG. 4 is substantially identical to cooling apparatus 300 described above in connection with FIG. 3, with the shared condenser embodiment being depicted by way of example only. The concepts disclosed herein are readily applicable to a cooling apparatus comprising a vapor-compression refrigeration system which embodies a single vapor-compression refrigeration loop configured to facilitate cooling of one or more electronic components coupled to one or more evaporators within the loop.

As noted, cooling apparatus 300' comprises a contaminant cold trap 400, which is coupled in fluid communication with the refrigerant loop (or refrigerant flow path) 305 of the vapor-compression refrigeration system, for example, between condenser 330 and expansion valve 350. The contaminant cold trap includes a refrigerant cold filter, and a coolant-cooled structure. At least a portion of refrigerant passing through the refrigerant flow path passes through the refrigerant cold filter, and the coolant-cooled structure provides cooling to the refrigerant cold filter to cool refrigerant passing through the refrigerant cold filter. Cooling of the refrigerant in the refrigerant cold filter allows contaminants to come out of solution (or solidify) from the refrigerant due to the cooling of the refrigerant, and thus, facilitates deposition of the contaminants within the refrigerant cold filter.

FIG. 4 illustrates one embodiment for cooling the coolant-cooled structure portion of the contaminant cold trap 400, and thus, facilitate cooling of refrigerant (e.g., the high-pressure, liquid refrigerant from condenser 330) passing through the refrigerant cold filter of the contaminant cold trap. As illustrated, a refrigerant return path 410 is coupled in fluid communication (via a flow splitter 401) with the refrigerant flow path 305 downstream from refrigerant expansion component 350. Generally, approximately 10% or less of the expanded, low-pressure refrigerant in the refrigerant flow path downstream of expansion component 350, is provided via refrigerant return path 410 back to contaminant cold trap 400, and in particular, to the coolant-cooled structure disposed within the contaminant cold trap for facilitating cooling of the refrigerant passing through the refrigerant flow path 305 upstream from refrigerant expansion component 350.

In one embodiment, the coolant-cooled structure comprises a second (or auxiliary) refrigerant evaporator, within which the portion of refrigerant provided via the refrigerant return path 410 boils to form low-pressure refrigerant vapor. A refrigerant bypass 420 is coupled in fluid communication between an outlet of the coolant-cooled structure and the refrigerant flow path 305 upstream of compressor 320, as illustrated in FIG. 4. By using a portion of the low-pressure refrigerant, downstream from the refrigerant expansion component (or valve) 350, to cool the coolant-cooled structure (i.e., auxiliary evaporator) within the contaminant cold trap, efficient cooling of the refrigerant cold filter is achieved. As one practical example, 3-5% of the low-pressure, liquid refrigerant downstream from expansion valve 350 may be provided back via the refrigerant return path 410 to the coolant-cooled structure of the contaminant cold trap to provide cooling to the refrigerant cold filter.

Figure 5:
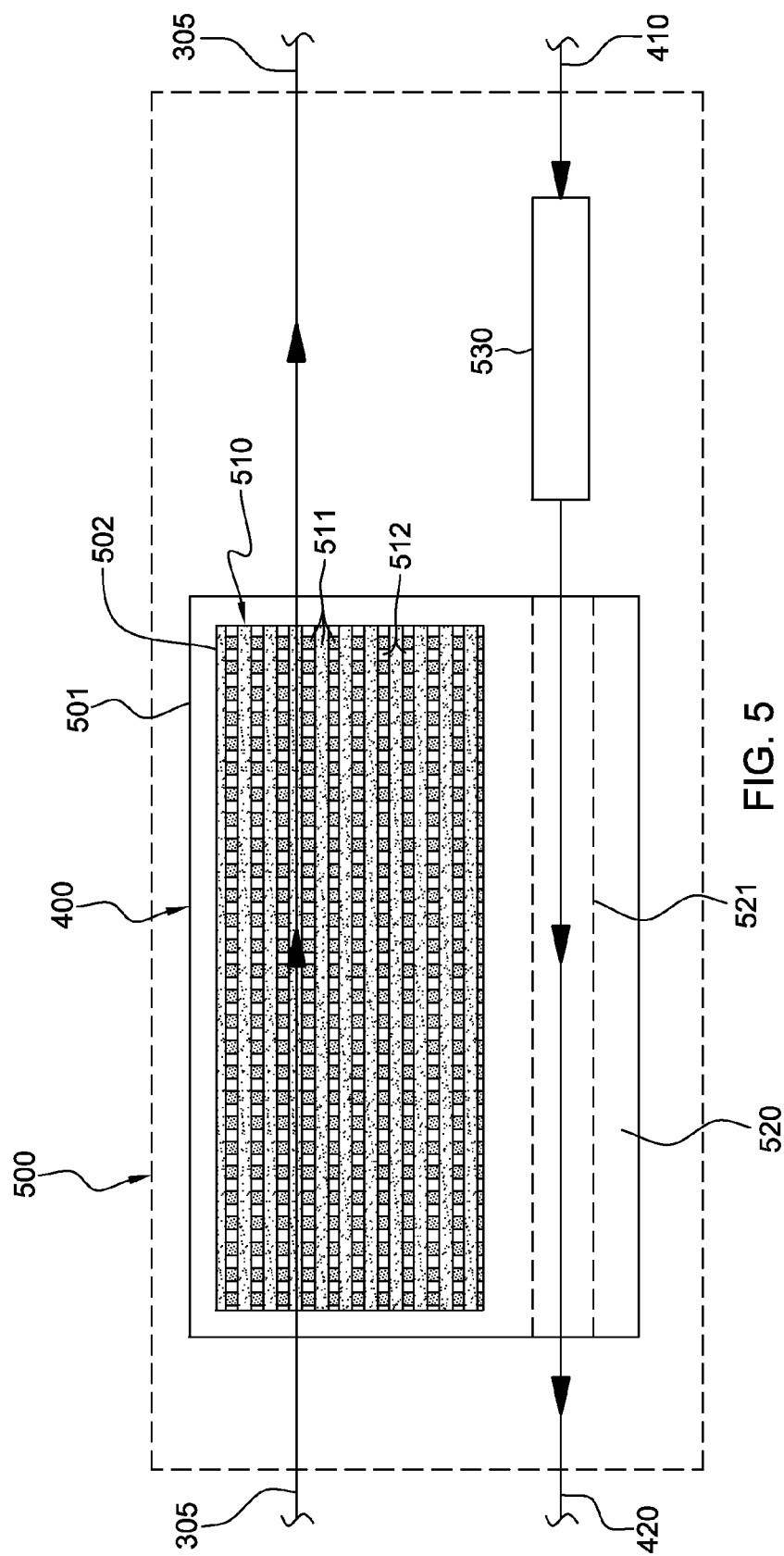
FIG. 5 depicts one embodiment of a contaminant cold trap for a vapor-compression refrigeration system, in accordance with one or more aspects aspect of the present invention.

FIG. 5 depicts one embodiment of a portion of a cooling apparatus 500 comprising a contaminant cold trap 400 employed in a vapor-compression refrigeration system, such as the vapor-compression refrigeration system 300' depicted in FIG. 4. As noted above, and as illustrated in FIG. 5, contaminant cold trap 400 includes a refrigerant cold filter 510 and a coolant-cooled structure 520. In the embodiment depicted, refrigerant cold filter 510 resides within a chamber 502 of a housing 501 of the contaminant cold trap, and is coupled in fluid communication with the refrigerant flow path 305, for example, upstream of the expansion valve 350 (see FIG. 4), between the condenser 330 and the expansion valve. In this location, high-pressure, liquid refrigerant flows through the refrigerant cold filter. By way of example, the refrigerant cold filter is a liquid-permeable structure which includes a plurality of thermally conductive surfaces across which the high-pressure, liquid refrigerant passes. The thermally conductive surfaces are configured and sized to facilitate cooling of the passing refrigerant and deposition of the solidifying contaminants onto the surfaces. Various liquid-permeable structure configurations may be employed, including, for example, a metal foam structure, metal mesh or screen, or an array of thermally conductive fins. For example, multiple sets of parallel fins 511 may be provided as a mesh structure, with openings 512 through which the refrigerant passes.

The extended, thermally conductive surfaces of the refrigerant cold filter 510 are cooled to, for example, a temperature below the temperature of the refrigerant within the expansion valve 350 (FIG. 3). By cooling the cold filter, the refrigerant passing through the cold filter is cooled, which allows contaminants in the refrigerant to solidify or precipitate out within the refrigerant cold filter, and to become deposited on one of the surfaces of the cold filter, rather than in a critical component, such as an adjustable expansion valve. As one example, the coolant-cooled structure 520 may be formed integral with housing 501 of contaminant cold trap 400, and be formed, for example, from a thermally conductive material. In one embodiment, the coolant-cooled structure may comprise an evaporator assembly with one or more flow boiling channels 521, through which the portion of refrigerant provided via refrigerant return path 410 flows. After boiling within the auxiliary evaporator (or coolant-cooled structure), the refrigerant is output as low-pressure vapor through the refrigerant bypass 420 for return, for example, to the refrigerant loop upstream of compressor 320 (see FIG. 4). In this embodiment, a further expansion component 530 is provided coupled in fluid communication with refrigerant return path 410 at the inlet to coolant-cooled structure 520 of contaminant cold trap 400. In one example, this auxiliary expansion component 530 may comprise a capillary tube or fixed expansion orifice, which provides further cooling of the portion of refrigerant returned to the contaminant cold trap to a temperature below the refrigerant temperature of the outlet of the expansion valve 350 (FIG. 4) to further enhance cooling of the refrigerant cold filter, and thus, the refrigerant passing through the cold filter.

Those skilled in the art will note that the contaminant cold trap disclosed herein advantageously facilitates solidifying contaminants from the working refrigerant in a designated region, i.e., the refrigerant cold filter. This designated region is provided to reduce adverse effects of the contaminants coming out of solution in more sensitive portions of the vapor-compression refrigeration system, such as, for example, within an expansion valve. Further, efficient cooling of the contaminant cold trap is achieved by using a portion of the refrigerant flow itself to cool the coolant-cooled structure of the cold trap.

Figure 6:
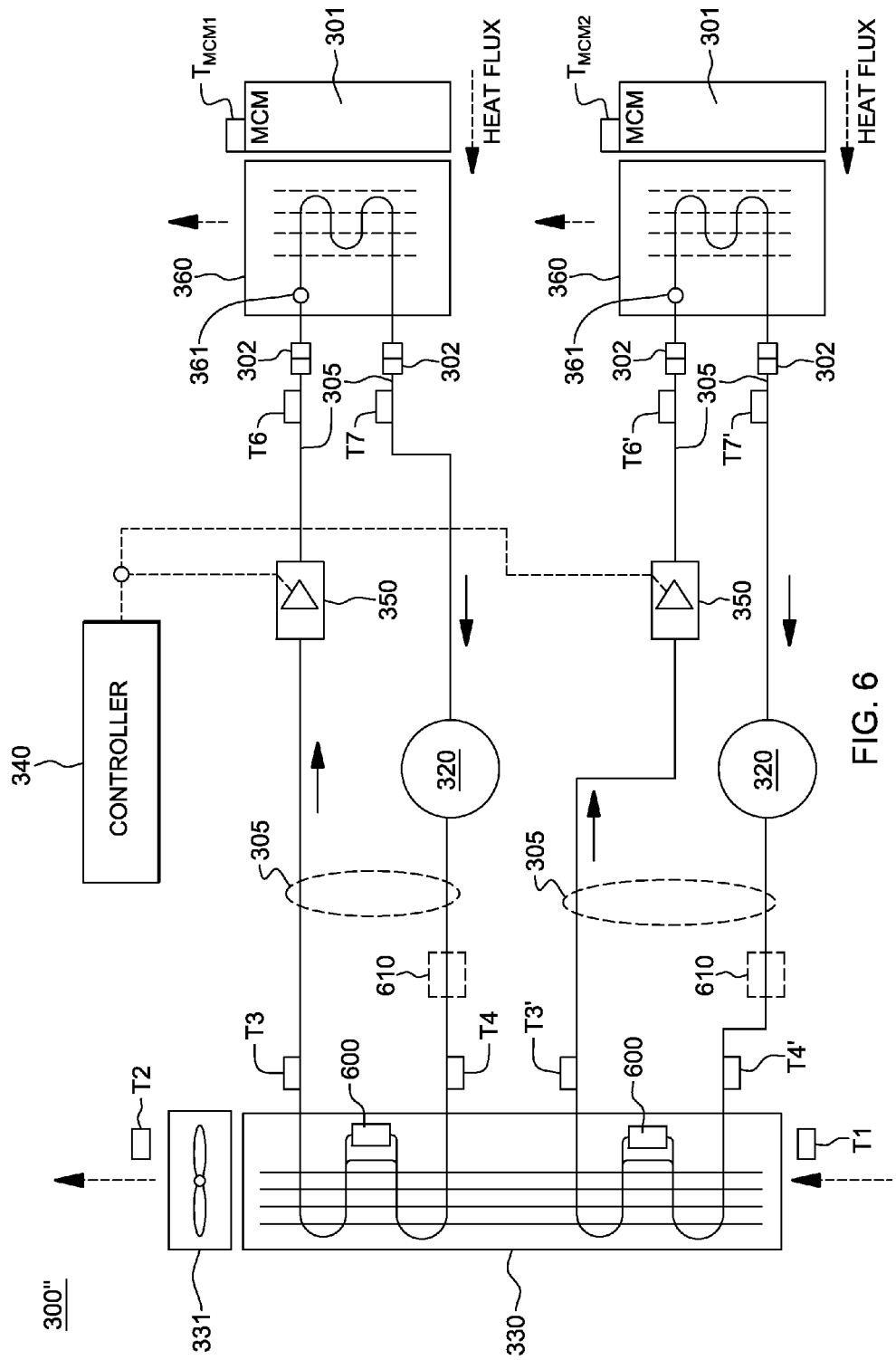
FIG. 6 is a schematic of another embodiment of a vapor compression refrigeration system for cooling one or more evaporators coupled to one or more respective electronic components to be cooled, and employing a contaminant extractor(s), in accordance with one or more aspects of the present invention.

In accordance with another aspect of the present invention, FIG. 6 depicts a variation of the cooling apparatus of FIG. 3, wherein a contaminant extractor is provided to facilitate removal of contaminants from refrigerant circulating through the refrigerant loop (or refrigerant flow path). In the embodiment of FIG. 6, a dual loop, cooled electronic system is depicted by way of example. However, those skilled in the art should note that the cooling apparatus depicted therein and described below can be readily configured as a single loop or other multi-loop system for cooling a single electronic component, or a plurality of electronic components (either with or without employing a shared condenser, as in the example of FIG. 6).

As described above, vapor-compression cycle refrigeration can be employed to cool electronic components, such as multichip modules, in electronics racks, such as main frame computers. The power variations in the multichip modules and energy efficiency concerns dictate that an electronic expansion valve (EEV) be employed to control the mass flow rate of refrigerant to the evaporator, which as noted above, is conduction coupled to the electronic component (e.g., MCM). Control of the MCM temperature within a desired band is achieved by manipulating the refrigerant flow rate via the EEV. The refrigerant, in practice, is supplemented by a lubricating oil for the compressor, and passes through fittings containing O-rings, and through a filter/dryer. These materials are somewhat mutually soluble, and thus may contaminate the refrigerant. In the EEV, and any other expansion component of the vapor-compression refrigeration loop, the thermodynamic state of the refrigerant and the contaminant mixture is altered, and the contaminants may come out of solution on working components of the system, such as the EEV internal surfaces.

Specifically, with relevance to the embodiment of FIG. 6, it has been discovered that material can become deposited within the evaporator due to boiling of refrigerant within the evaporator, which could affect operation of the evaporator over time.

One solution to the problem is depicted in FIG. 6. As noted, cooling apparatus 300" depicted in FIG. 6 is substantially identical to cooling apparatus 300 described above in connection with FIG. 3, with the shared condenser embodiment being depicted by way of example only. The concepts disclosed herein are readily applicable to a cooling apparatus comprising a vapor-compression refrigeration system which embodies a single vapor-compression refrigeration loop configured to facilitate cooling of one or more electronic components coupled to one or more evaporators within the loop.

As noted, cooling apparatus 300" comprises a contaminant extractor 600, which is (in one embodiment) an intra-condenser extractor coupled in fluid communication with the section of the refrigerant loop (or refrigerant flow path) 305 of the vapor-compression refrigeration system that passes through the condenser 330. The contaminant extractor includes a refrigerant boiling filter and a heater. At least a portion of refrigerant passing through the refrigerant flow path passes through the refrigerant boiling filter, and the heater provides heat to the refrigerant boiling filter to boil refrigerant passing through the refrigerant boiling filter. Boiling of the refrigerant in the refrigerant boiling filter allows contaminants to come out of solution (or distill) from the refrigerant due to the boiling of the refrigerant, and thus, facilitates deposition of the contaminants within the refrigerant boiling filter.

FIG. 6 illustrates one implementation of a cooling apparatus comprising an intra-condenser contaminant extractor 600, which is coupled in parallel with a portion of the tubing within condenser 330. In particular, in one implementation, the intra-condenser contaminant extractor is coupled to the condenser 330 at a location within the condenser where the refrigerant comprises a liquid-gas mixture. A portion of this liquid-gas mixture enters the contaminant extractor, which as noted, includes a heater which boils the liquid refrigerant completely, causing any contaminants in the liquid-gas mixture to be extracted (or plated out) onto the surfaces of the extractor at any one time. In one example, less than approximately 25% of the refrigerant passing within the refrigerant flow path within the condenser is directed through the contaminant extractor. In one specific implementation, 10-25% of the refrigerant passing through the condenser is directed through the contaminant extractor. This can be achieved by providing tubing directing a portion of the refrigerant passing through the condenser to also pass through the contaminant extractor. After passing through the contaminant extractor, the high-pressure refrigerant vapor is returned to the condenser for condensing into high-pressure liquid refrigerant for return via the refrigerant flow path to the one or more expansion devices and the evaporator.

Those skilled in the art will note that the contaminant extractor described herein can be disposed in various places within the vapor-compression refrigeration loop. However, by coupling the contaminant extractor in parallel fluid communication with a portion of the refrigerant flow path passing through the condenser, less heat is required in order to boil the portion of refrigerant passing through the filter, and thus, to extract any contaminants within that portion of the refrigerant. During sequential vapor-compression cycles, contaminants are cleaned from the refrigerant by boiling and filtering of the contaminants within the contaminant extractor. The contaminant extractor is advantageously positioned in the refrigerant stream after the compressor and before the expansion device(s) to remove contaminants that may be introduced within the compressor to prevent the contaminants from reaching the expansion device(s) and evaporator.

Figure 7:
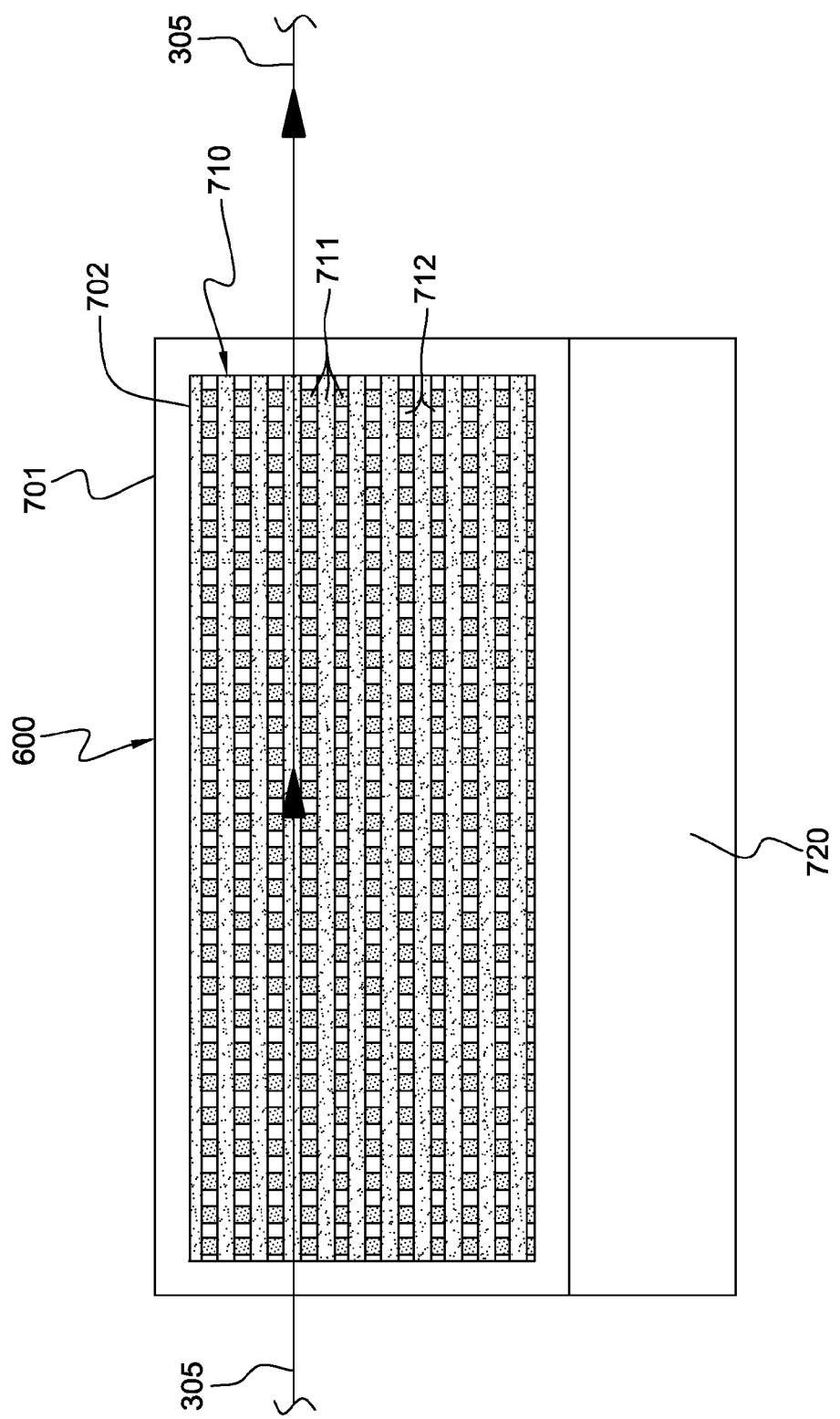
FIG. 7 depicts one embodiment of a contaminant extractor for the vapor compression refrigeration system of FIG. 6, in accordance with one or more aspects of the present invention.

FIG. 7 depicts one embodiment of a contaminant extractor 600 to be employed in a vapor-compression refrigeration system, such as the vapor-compression refrigeration system 300" depicted in FIG. 6. As noted above, and as illustrated in FIG. 7, contaminant extractor 600 includes a refrigerant boiling filter 710 and a heater 720. In the embodiment depicted, refrigerant boiling filter 710 resides within a chamber 702 of a housing 701 of the contaminant extractor, and is coupled in fluid communication with the refrigerant flow path 305, for example, midstream of the condenser 330 (see FIG. 6). In this location, a high-pressure liquid-gas refrigerant mixture is directed through the refrigerant boiling filter. Tubing and filter structures of the contaminant extractor are sized to allow a desired portion of the refrigerant flow to be diverted from the condenser through the filter, and a flow restriction such as an orifice or section of small diameter tubing may be used in the refrigerant path through the condenser in a parallel fluid flow to the contaminant extractor to further control the ratio of refrigerant flow that passes through the filter.

By way of example, the refrigerant boiling filter is a fluid-permeable structure which includes a plurality of thermally conductive surfaces across which the high-pressure, liquid gas refrigerant passes. The thermally conductive surfaces are configured and sized to facilitate boiling of the passing refrigeration and deposition of the extracted contaminants onto the surfaces of the filter. Various fluid-permeable structure configurations may be employed, including, for example, a metal foam structure, metal mesh or screen, or an array of thermally conductive fins. For example, multiple sets of parallel fins 711 may be provided as a mesh structure, with openings 712 through which the refrigerant passes.

The extended, thermally conductive surfaces of the refrigerant boiling filter 710 are heated to, for example, a temperature above the boiling temperature of the refrigerant within the condenser 330 (FIG. 6). By heating the boiling filter, the refrigerant passing through the boiling filter is heated, which allows contaminants in the refrigerant to come out of solution within the refrigerant boiling filter, and to become deposited on one of the surfaces of the boiling filter, rather than in a critical component, such as an adjustable expansion valve. As one example, the heater 720 may be a resistive-type heater thermally coupled to housing 701 of contaminant extractor 600, and be formed of or reside in, for example, a thermally conductive material. After boiling within the extractor, the refrigerant is output as high-pressure vapor for return to the condenser 330 (FIG. 6).

In addition to the above-described contaminant extractor, adsorption is an alternative (or additional) filtering approach, which may assist in removing impurities from refrigerant before reaching the one or more expansion devices. In the case of adsorption purification, the high-pressure refrigerant and impurity vapor mixture exiting the compressor is flowed through an in-line container 610 installed in fluid communication with the refrigerant flow path before condenser 330, as illustrated in FIG. 6. This in-line container 610 may comprise solid grains or a mesh, to which the impurity preferentially adsorbs. Thus, the gas mixture leaving the adsorption purifier is comparatively pure and can be condensed and used in the refrigeration cycle. In one embodiment, the adsorption chamber 610 would need to be occasionally replaced or regenerated.

Those skilled in the art will note that the contaminant extractor disclosed herein advantageously facilitates removal of contaminants from the working refrigerant in a designated region, i.e., the refrigerant boiling filter. This designated region is provided to reduce adverse effects of the contaminants coming out of solution in more sensitive portions of the vapor-compression refrigeration system, such as, for example, within an expansion valve. Further, efficient heating by the contaminant extractor is achieved by passing a portion of the refrigerant flow within the condenser through the boiling filter.

Figure 8:
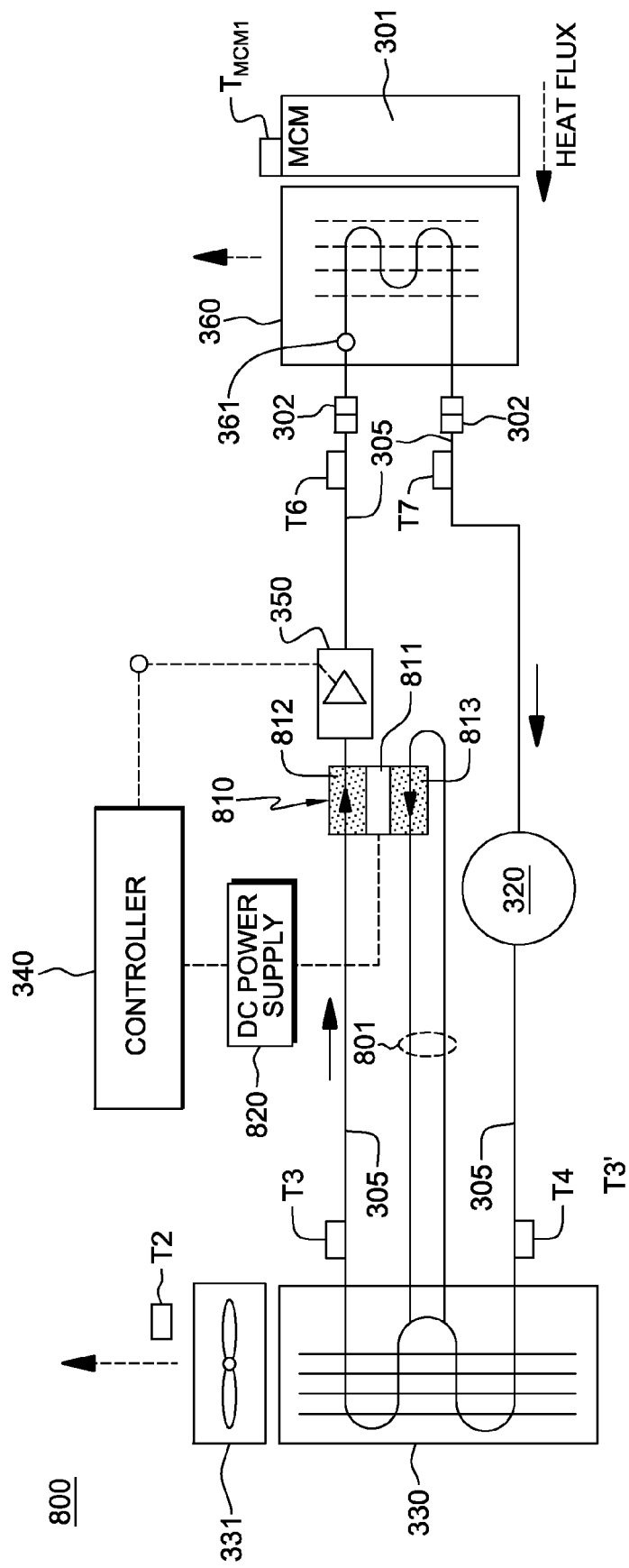
FIG. 8 is a schematic of another embodiment of a vapor compression refrigeration system for cooling one or more evaporators coupled to one or more respective electronic components to be cooled and employing a contaminant separator(s), in accordance with one or more aspects of the present invention.

In accordance with another aspect of the present invention, FIG. 8 depicts a variation of the cooling apparatuses of FIGS. 3-7, wherein a contaminant separator is provided to facilitate removal of contaminants from refrigerant circulating through the refrigerant loop (or refrigerant flow path). In the embodiment of FIG. 8, a dual loop, cooled electronic system is again depicted by way of example only. Those skilled in the art will note that the cooling apparatus depicted therein and described below can be readily configured as a single loop or other multi-loop system for cooling a single electronic component, or a plurality of electronic components (either with or without employing a shared condenser, as in the examples of FIGS. 4 & 6).

As depicted in FIG. 8, cooled electronic system 800 is substantially identical to the cooled electronic systems and cooling apparatuses described above in connection with FIGS. 3-7. In this embodiment, however, cooled electronic system 800 includes a contaminant separator 810, which in one embodiment, comprises a refrigerant cold trap 812, a thermoelectric array 811 and a contaminant extractor 813, with the thermoelectric array being disposed between the refrigerant cold trap 812 and the refrigerant extractor 813 to facilitate cooling of refrigerant passing through the refrigerant cold trap, and heating of liquid refrigerant passing through the refrigerant extractor 813. Controller 340 controls the electrical current supplied by a DC power supply 820 to thermoelectric array 811 to control the heat transfer process within the contaminant separator. As illustrated, contaminant extractor 813 is disposed in a refrigerant line 801 coupled in fluid communication with and parallel to at least a portion of the refrigerant flow path through the condenser 330. In one embodiment, the refrigerant cold trap 812 comprises a refrigerant cold trap such as described above in connection with the apparatus of FIGS. 4-5, and the refrigerant extractor comprises a refrigerant boiling filter such as described above in connection with the apparatus of FIGS. 6-7.

In operation, the thermoelectric array pumps heat from a cold side to a hot side when an electrical current is applied. The contaminant separator which is coupled in fluid communication with the refrigerant flow path 305, receives a high pressure liquid refrigerant flow from upstream of the refrigerant expansion device 350, and passes at least a portion of the refrigerant flow through the refrigerant cold trap 812 for removing contaminants solidifying from the refrigerant due to cooling of the refrigerant in the refrigerant cold filter. In this embodiment, the refrigerant cold trap is thermally coupled to the cold side of the thermoelectric array, and exhausts high pressure liquid refrigerant to the refrigerant expansion device 350. The contaminant separator also receives (through refrigerant line 801) a high pressure liquid-vapor mixture diverted from the condenser 330, which is passed through contaminant extractor 813. Contaminant extractor 813 is thermally coupled to the hot side of the thermoelectric array 811 for preferentially accumulating contaminants in the refrigerant hot filter of the contaminant extractor rather than letting the contaminants continue to circulate to the refrigerant expansion device and evaporator. The refrigerant extractor exhausts high pressure vapor refrigerant back to the condenser flow path, as illustrated in FIG. 8.

Figure 9:
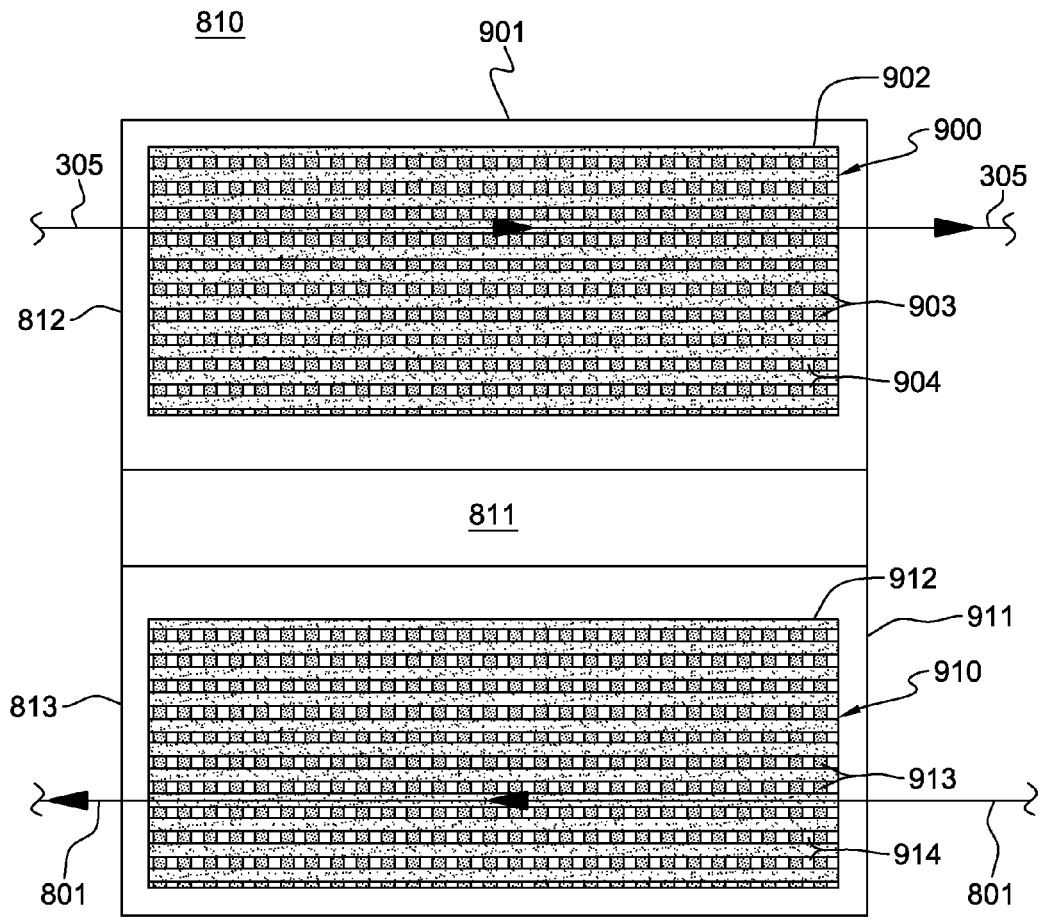
FIG. 9 depicts one embodiment of a contaminant separator for the vapor compression refrigeration system of FIG. 8, in accordance with one or more aspects of the present invention.

FIG. 9 depicts one embodiment of contaminant separator 810 for a vapor compression refrigeration system, such as the vapor-compression refrigeration system 800 depicted in FIG. 8. As noted above, and as illustrated in FIG. 9, contaminant separator 810 includes thermoelectric array 811, contaminant cold trap 812 and contaminant extractor 813. Contaminant cold trap 812 includes a refrigerant cold filter 900, which resides in a chamber 902 of a housing 901 of the contaminant cold trap, and is coupled in fluid communication with the refrigerant flow path 305, for example, upstream of expansion valve 350 (FIG. 8), between condenser 330 and the expansion valve. In this location, high pressure, liquid refrigerant flows through the refrigerant cold filter. By way of example, the refrigerant cold filter is a liquid-permeable structure which includes a plurality of thermally conductive surfaces across which the high pressure, liquid refrigerant passes. The thermally conductive surfaces are configured and sized to facilitate cooling of the passing refrigerant and deposition of the solidifying contaminants onto the surfaces. Various liquid-permeable structure configurations may be employed, including, for example, a metal foam structure, metal mesh or screen, or an array of thermally conductive fins. By way of example, multiple sets of parallel fins 903 may be provided as a mesh structure, with openings 904 through which the refrigerant passes.

The extended, thermally conductive surfaces of refrigerant cold filter 900 are cooled to, for example, a temperature below the temperature of the refrigerant within the expansion valve 350 (FIG. 8). By cooling the cold filter, the refrigerant passing through the cold filter is cooled, which allows contaminants in the refrigerant to solidify or precipitate out within the refrigerant cold filter and to become deposited on one or more surfaces of the cold filter, rather than a critical component, such as the adjustable expansion valve. As one example, the refrigerant cold trap 812, thermoelectric array 811 and refrigerant extractor 813 may be fabricated as a stacked structure, such as depicted in FIG. 9.

Figure 10:
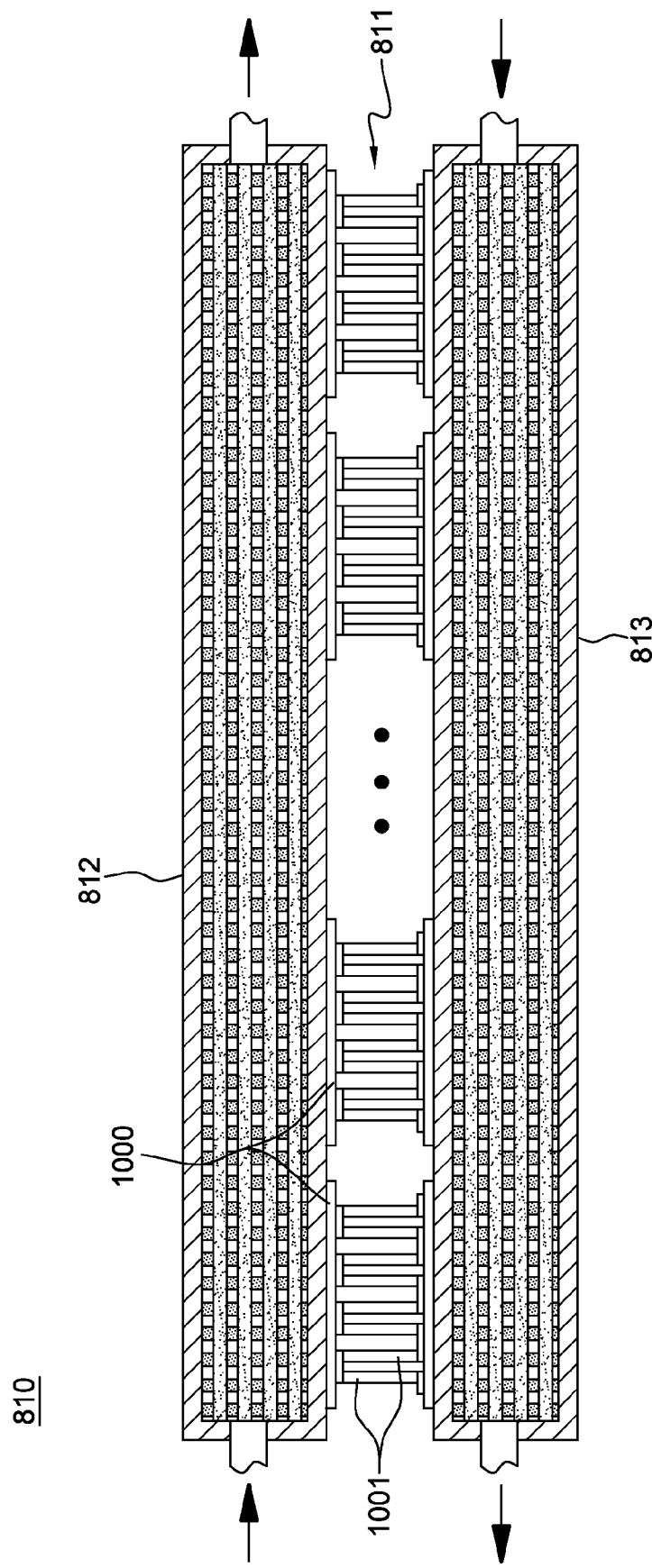
FIG. 10 is a cross-sectional elevational view of one embodiment of the contaminant separator of the vapor-compression refrigeration system of FIG. 8, and shown comprising a thermoelectric-enhanced fluid-to-fluid heat exchange assembly, in accordance with one or more aspects of the present invention.

One embodiment of the thermoelectric array 811 of contaminant separator 810 is depicted in greater detail in FIG. 10. Note that in this example, the contaminant separator comprises a thermoelectric-enhanced, fluid-to-fluid heat exchange assembly. As illustrated in FIG. 10, thermoelectric array 811 comprises in one example, a plurality of thermoelectric modules 1000, each of which comprises individual thermoelectric elements 1001.

The use of large thermoelectric cooling elements is known. These elements operate electronically to produce a cooling effect. By passing a direct current through the legs of a thermoelectric device, a heat flow is produced across the device which may be contrary to that which would be expected from Fourier's law.

At one junction of the thermoelectric element, both holes and electrons move away, towards the other junction, as a consequence of the current flow through the junction. Holes move through the p-type material and electrons through the n-type material. To compensate for this loss of charge carriers, additional electrons are raised from the valence band to the conduction band to create new pairs of electrons and holes. Since energy is required to do this, heat is absorbed at this junction. Conversely, as an electron drops into a hole at the other junction, its surplus energy is released in the form of heat. This transfer of thermal energy from the cold junction to the hot junction is known as the Peltier effect.

Use of the Peltier effect permits the surfaces attached to a heat source to be maintained at a temperature below that of a surface attached to a heat sink. What these thermoelectric modules provide is the ability to operate the cold side below the ambient temperature of the cooling medium (e.g., air or water). When direct current is passed through the thermoelectric modules, a temperature difference is produced with the result that one side is relatively cooler than the other side. These thermoelectric modules are therefore seen to possess a hot side and a cold side, and provide a mechanism for facilitating the transfer of thermal energy from the cold side of the thermoelectric module to the hot side of the thermoelectric module.

By way of specific example, thermoelectric modules 1000 may comprise TEC CP-2-127-06L modules, offered by Melcor Laird, of Cleveland, Ohio.

Note that the thermoelectric array may comprise any number of thermoelectric modules, including one or more modules, and is dependent (in part) on the size of the cold trap and extractor, as well as the amount of heat to be transferred from refrigerant flowing through contaminant extractor 813, to refrigerant flowing through contaminant cold trap 812. Also note that an insulated material (not shown) may be provided over one or more of the exposed surfaces of refrigerant cold trap 812 or refrigerant extractor 813. As noted above, heat is transferred from refrigerant within the contaminant cold trap 812 to refrigerant within the refrigerant extractor 813. In operation, the amount of heat transferred to contaminant extractor 813 exceeds the amount of heat extracted from contaminant cold trap 812 by an amount equal to the losses in the thermoelectric modules 1000.

The thermoelectric (TE) array may comprise a planar thermoelectric array with modules arranged in a square or rectangular array. Although the wiring is not shown, each thermoelectric module in a column may be wired and supplied electric current (I) in series and the columns of thermoelectric modules may be electrically wired in parallel so that the total current supplied would be I×sqrt(M) for a square array comprising M thermoelectric modules, providing an appreciation of the inherent scalability of the array. In this way, if a single thermoelectric module should fail, only one column is effected, and electric current to the remaining columns may be increased to compensate for the failure.

Table 1 provides an example of the scalability provided by a planar thermoelectric heat exchanger configuration such as described herein.

TABLE 1

| Number of TE Modules (M) | Heat Exchanger Size |
|---|---|
| 81 | 585 mm × 585 mm (23.0 in. × 23.0 in.) |
| 100 | 650 mm × 650 mm (25.6 in. × 25.6 in.) |
| 121 | 715 mm × 715 mm (28.2 in. × 28.2 in.) |
| 144 | 780 mm × 780 mm (30.7 in. × 30.7 in.) |
| 169 | 845 mm × 845 mm (33.3 in. × 33.3 in.) |

For a fixed electric current and temperature difference across the thermoelectric modules, the heat pumped by the thermoelectric array will scale with the number of thermoelectric modules in the platform area. Thus, the heat load capability of a 650 mm×650 mm thermoelectric heat exchanger will be 1.23 times that of a 585 mm×585 mm thermoelectric heat exchanger, and that of an 845 mm×845 mm will be 2.09 times greater. Note that the size of the liquid-to-air heat exchanger may need to grow to accommodate the increased heat load from the thermoelectric arrays. If the space available for the thermoelectric heat exchanger is constrained in the X×Y dimensions, then the heat pumping capabilities can still be scaled upwards by growing in the Z dimension. This can be done by utilizing multiple layers of thermoelectric modules between multiple heat exchange elements, with alternating hot and cold sides, as described in the above-referenced U.S. Pat. No. 6,557,354 B1.

Returning to FIG. 9, contaminant extractor 813 is shown to include a refrigerant hot filter (or refrigerant boiling filter) 910. In one embodiment, the contaminant extractor 813 comprises an intra-condenser contaminant extractor wherein liquid-vapor refrigerant is redirected via refrigerant line 801 from within a portion of the condenser 330 (FIG. 8) to pass through contaminant extractor 813. Refrigerant hot filter 910 resides within a chamber 912 of a housing 911 of the contaminant extractor and is coupled in fluid communication with refrigerant line 801, which redirects refrigerant from, for example, midstream of condenser 330 (FIG. 8). In this location, high pressure liquid-gas refrigerant mixture is directed through the refrigerant boiling filter. Tubing and filter structures of the contaminant extractor are sized to allow a desired portion of the refrigerant flow to be diverted from the condenser through the filter, and a flow restrictor such as an orifice or section of a small diameter tubing may be used in the refrigerant path through the condenser in the parallel fluid flow to the contaminant extractor to further control the ratio of refrigerant flow that passes through the refrigerant hot filter 910.

By way of example, the refrigerant hot filter is a fluid-permeable structure which includes a plurality of thermally conductive surfaces across which the high pressure, liquid-gas refrigerant passes. The thermally conductive surfaces are configured and sized to facilitate boiling of the passing refrigerant and deposition of the extracted contaminants on the surfaces of the filter. Various fluid-permeable structure configurations may be employed, including, for example, a metal foam structure, metal mesh or screen structure or an array of thermally conductive fins. For example, multiple sets of parallel fins 913 may be provided as a mesh structure with openings 914 through which the refrigerant passes.

Contaminant extractor 813 is coupled to the hot side of the thermoelectric array 811, and the thermoelectric array 811 heats the thermally conductive surfaces of the refrigerant hot filter 910 to, for example, a temperature above the boiling temperature of the refrigerant within the condenser 330 (FIG. 8). By heating the boiling filter, the refrigerant passing through the boiling filter is heated, which allows contaminants in the refrigerant to come out of solution within the refrigerant boiling filter, and to become deposited on one of the surfaces of the boiling filter, rather than in a critical component such as an adjustable expansion valve or evaporator. As noted, commensurate with heating the refrigerant within contaminant extractor 813, thermoelectric array 811 cools refrigerant passing through contaminant cold trap 812. Thus, two different mechanisms for extracting contaminants from the refrigerant are simultaneously provided within contaminant separator 810. Within contaminant cold trap 812, contaminants solidifying from the refrigerant due to cooling of the refrigerant are deposited, while within contaminant extractor 813, contaminants extracted from the refrigerant due to boiling of the refrigerant are deposited.

Figure 11:
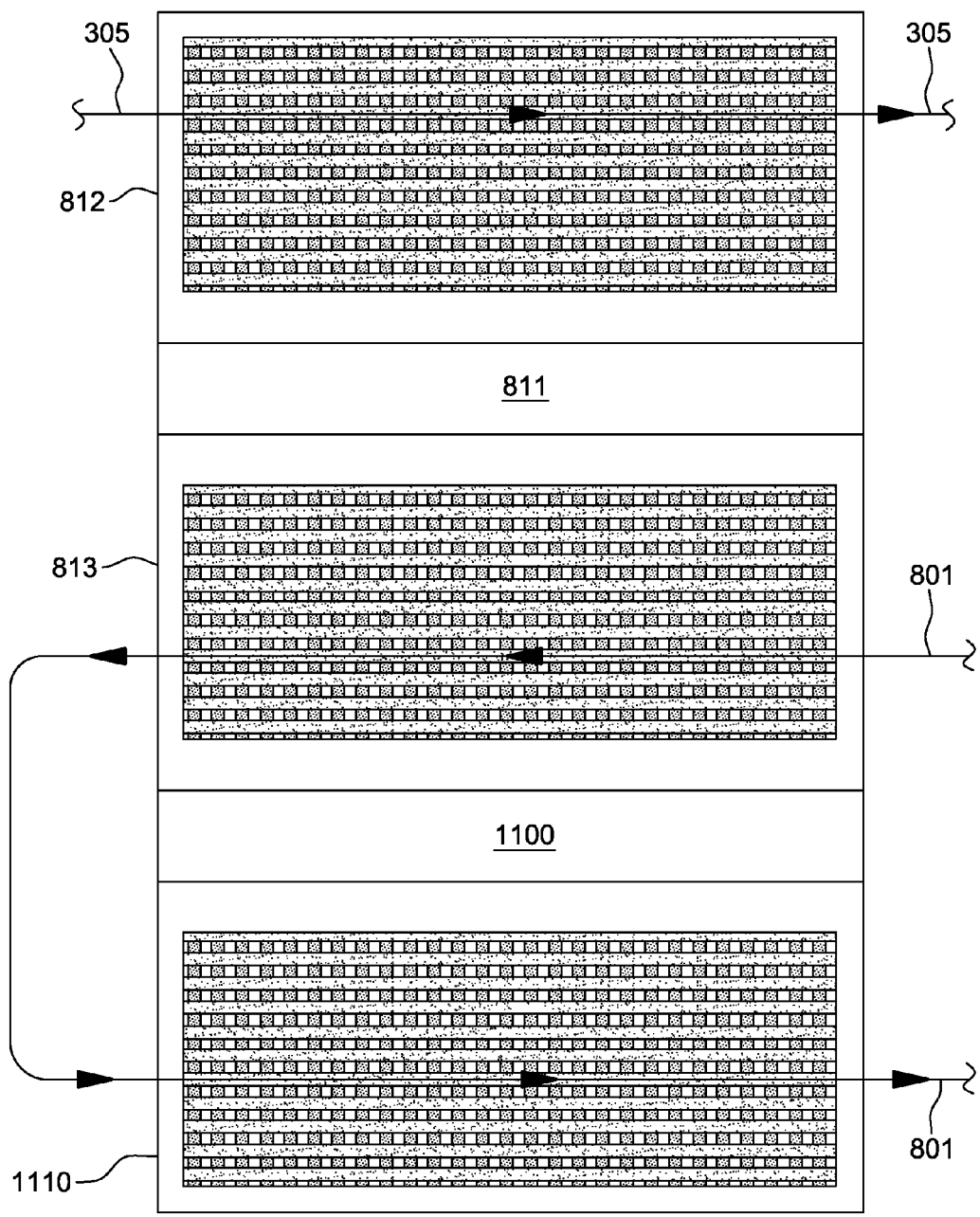
FIG. 11 depicts an alternate embodiment of a contaminant separator for a vapor compression refrigeration system, in accordance with one or more aspects of the present invention.

FIG. 11 depicts an alternate embodiment of a contaminant separator 810' for a cooled electronic system such as depicted in FIG. 8, in accordance with one or more aspects of the present invention. In this embodiment, contaminant separator 810' comprises a stacked structure with thermoelectric array 811 disposed between contaminant cold trap 812 and contaminant extractor 813, as described above in connection with FIGS. 8-10. Additionally, a second thermoelectric array 1100 is disposed between contaminant extractor 813 and a heat exchange element 1110, with the hot side of the second thermoelectric array 1100 being in thermal contact with contaminant extractor 813, and the cold side being in thermal contact with the heat exchange element 1110. In one embodiment, second thermoelectric array 1100 is substantially identical to the above-described thermoelectric array 811. However, in an alternate embodiment, the thermoelectric arrays may be differently configured and/or sized to provide, for example, different amounts of thermoelectric heat pumping across the arrays. Further, both thermoelectric arrays are separately controllable by, for example, controller 340 of the cooled electronic system depicted in FIG. 8, with the same or different amounts of DC power being supplied to the different thermoelectric arrays, as desired (for example, to accomplish the contaminant extraction described herein). In the embodiment depicted of FIG. 11, a high pressure liquid-gas mixture is diverted from a mid-condenser flow path into the refrigerant boiling filter section of contaminant extractor 813 via refrigerant line 801. Contaminant extractor 813 is heated on two sides, by first thermoelectric array 811 and second thermoelectric array 1100, which facilitates boiling of liquid refrigerant passing through the refrigerant boiling filter of the contaminant extractor 813. Thus, in one embodiment, the first thermoelectric array 811 and second thermoelectric array 1100 are thermally coupled on their hot side to contaminant extractor 813, and on their cold side to contaminant cold trap 812, and heat exchange element 1110, respectively. Note that in one example, heat exchange element 1110 may comprise a structure similar to contaminant cold trap 812 or contaminant extractor 813. Such a configuration improves efficiency of the contaminant separator. However, in an alternate embodiment, the cold side of the second thermoelectric array 1100 may be attached to an independent heat sink, or to any component(s)

within the refrigerant loop to be cooled (such as to control electronics, a compressor housing, etc.).

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprise" (and any form of comprise, such as "comprises" and "comprising"), "have" (and any form of have, such as "has" and "having"), "include" (and any form of include, such as "includes" and "including"), and "contain" (and any form contain, such as "contains" and "containing") are open-ended linking verbs. As a result, a method or device that "comprises", "has", "includes" or "contains" one or more steps or elements possesses those one or more steps or elements, but is not limited to possessing only those one or more steps or elements. Likewise, a step of a method or an element of a device that "comprises", "has", "includes" or "contains" one or more features possesses those one or more features, but is not limited to possessing only those one or more features. Furthermore, a device or structure that is configured in a certain way is configured in at least that way, but may also be configured in ways that are not listed.

The corresponding structures, materials, acts, and equivalents of all means or step plus function elements in the claims below, if any, are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention.

What is claimed is:

1. An apparatus for facilitating cooling of an electronic component, the apparatus comprising:
    a vapor-compression refrigeration system comprising a refrigerant expansion component, a refrigerant evaporator, a compressor and a condenser coupled in fluid communication to define a refrigerant flow path and allow the flow of refrigerant therethrough, the refrigerant evaporator being configured to couple to the electronic component; and
    a contaminant separator coupled in fluid communication with the refrigerant flow path, the contaminant separator comprising:
        a first filter and a second filter, the first filter and the second filter being coupled to the refrigerant flow path at different locations along the refrigerant flow path, wherein at least a portion of refrigerant passing through the refrigerant flow path passes through the first filter and passes through the second filter, the first filter being a cooling filter cooling the refrigerant passing therethrough, and the second filter being a heating filter heating the refrigerant passing therethrough; and
        a thermoelectric array comprising at least one thermoelectric module, the thermoelectric array being coupled at a first side to the first filter and at a second side to the second filter, and providing cooling to the first filter to cool refrigerant passing through the first filter, and facilitate deposition in the first filter of contaminants solidifying from the refrigerant due to cooling of the refrigerant in the first filter, an providing heating to the second filter to heat refrigerant passing through the second filter, and facilitate deposition in the second filter of contaminants extracted from the refrigerant by heating of the refrigerant in the second filter.

2. The apparatus of claim 1, wherein the first filter is coupled in fluid communication with the refrigerant flow path upstream of the refrigerant expansion component, and the second filter is coupled to the refrigerant flow path upstream of the first filter.

3. The apparatus of claim 1, wherein the second filter comprises a refrigerant boiling filter to boil refrigerant passing through the refrigerant boiling filter, and facilitate deposition in the refrigerant boiling filter of contaminants extracted from the refrigerant due to boiling of the refrigerant in the refrigerant boiling filter.

4. The apparatus of claim 1, wherein the second filter is coupled in fluid communication with and parallel to at least a portion of a refrigerant path through the condenser.

5. The apparatus of claim 1, wherein the first filter comprises a liquid-permeable structure which includes thermally conductive surfaces across which refrigerant passing through the contaminant separator flows, and wherein the thermoelectric array provides conduction cooling to the thermally conductive surfaces of the liquid-permeable structure across which the refrigerant flows to facilitate contaminants solidifying from the refrigerant due to cooling of the refrigerant.

6. The apparatus of claim 5, wherein the second filter comprises a fluid-permeable structure which includes thermally conductive surfaces across which the refrigerant passing through the second filter passes, and wherein the thermoelectric array heats the thermally conductive surfaces of the fluid-permeable structure of the second filter across which the refrigerant passes to facilitate boiling of liquid refrigerant and extracting of contaminants from the refrigerant due to heating of the refrigerant.

7. The apparatus of claim 6, wherein the first filter comprises one of a metal foam structure, metal mesh or screen structure, or an array of thermally conductive fins, and wherein the second filter comprises one of a metal foam structure, metal mesh or screen structure, or an array of thermally conductive fins.

8. A cooled electronic system comprising:
    at least one heat generating electronic component;
    a vapor-compression refrigeration system coupled to the at least one heating generating electronic component, the vapor compression refrigeration system comprising:
        a refrigerant expansion component;
        a refrigerator evaporator, the refrigerant evaporator being coupled to the at least one heat generating electronic component;
        a compressor; and
        a condenser,
    a refrigerant flow path coupling in fluid communication the refrigerant expansion component, the refrigerant evaporator, the compressor and the condenser; and
    a contaminant separator coupled in fluid communication with the refrigerant flow path, the refrigerant separator including:
        a first filter and a second filter, the first filter and the second filter being coupled to the refrigerant flow path at different locations along the refrigerant flow path, wherein at least a portion of refrigerant passing through the refrigerant flow path passes through the first filter and passes through the second filter, the first filter being a cooling filter cooling the refrigerant passing therethrough, and the second filter being a heating filter heating the refrigerant passing therethrough; and a thermoelectric array comprising at least one thermoelectric module, the thermoelectric array being coupled at a first side to the first filter and at a second side to the second filter, and providing cooling to the first filter to cool refrigerant passing through the first filter, and facilitate deposition in the first filter of contaminants solidifying from the refrigerant due to cooling of the refrigerant in the first filter, and providing heating to the second filter to heat refrigerant passing through the second filter, and facilitate deposition in the second filter of contaminants extracted from the refrigerant by heating of the refrigerant in the second filter.

9. The cooled electronic system of claim 8, wherein the first filter is coupled in fluid communication with the refrigerant flow path upstream of the refrigerant expansion component, and the second filter is coupled to the refrigerant flow path upstream of the first filter.

10. The cooled electronic system of claim 8, wherein the second filter comprises a refrigerant boiling filter to boil refrigerant passing through the refrigerant boiling filter, and facilitate deposition in the refrigerant boiling filter of contaminants extracted from the refrigerant due to boiling of the refrigerant in the refrigerant boiling filter.

11. The cooled electronic system of claim 8, wherein the second filter is coupled in fluid communication with and parallel to at least a portion of a refrigerant path through the condenser.

12. The cooled electronic system of claim 8, wherein the first filter comprises a liquid-permeable structure which includes thermally conductive surfaces across which refrigerant passing through the contaminant separator flows, and wherein the thermoelectric array provides conduction cooling to the thermally conductive surfaces of the liquid-permeable structure across which the refrigerant flows to facilitate contaminants solidifying from the refrigerant due to cooling of the refrigerant.

13. The cooled electronic system of claim 12, wherein the second filter comprises a fluid-permeable structure which includes thermally conductive surfaces across which the refrigerant passing through the second filter passes, and wherein the thermoelectric array heats the thermally conductive surfaces of the fluid-permeable structure of the second filter across which the refrigerant passes to facilitate boiling of liquid refrigerant and extracting of contaminants from the refrigerant due to heating of the refrigerant.

14. The cooled electronic system of claim 13, wherein the first filter comprises one of a metal foam structure, metal mesh or screen structure, or an array of thermally conductive fins, and wherein the second filter comprises one of a metal foam structure, metal mesh or screen structure, or an array of thermally conductive fins.

15. A method of fabricating a vapor-compression refrigeration system for cooling at least one heating generating electronic component, the method comprising:
providing a condenser, a refrigerant expansion structure, a refrigerant evaporator, and a compressor;
coupling the condenser, refrigerant expansion structure, refrigerant evaporator and compressor in fluid communication to define a refrigerant flow path;
providing a contaminant separator in fluid communication with the refrigerant flow path, the refrigerant separator including:
a first filter and a second filter, the first filter and the second filter being coupled to the refrigerant flow path at different locations along the refrigerant flow path, wherein at least a portion of refrigerant passing through the refrigerant flow path passes through the first filter and passes through the second filter, the first filter being a cooling filter cooling the refrigerant passing therethrough, and the second filter being a heating filter heating the refrigerant passing therethrough; and
a thermoelectric array comprising at least one thermoelectric module, the thermoelectric array being coupled at a first side to the first filter and at a second side to the second filter, and providing cooling to the first filter to cool refrigerant passing through the first filter, and facilitate deposition in the first filter of contaminants solidifying from the refrigerant due to cooling of the refrigerant in the first filter, and providing heating to the second filter to heat refrigerant passing through the second filter, and facilitate deposition in the second filter of contaminants extracted from the refrigerant by heating of the refrigerant in the second filter; and
providing refrigerant within the refrigerant flow path of the vapor-compression refrigeration system to allow for cooling of the at least one heat-generating electronic component, wherein the contaminant separator removes contaminants from the refrigerant commensurate with cooling of the at least one heat-generating electronic component.

* * * * *